(12) United States Patent
Delfosse et al.

(10) Patent No.: US 12,632,769 B2
(45) Date of Patent: May 19, 2026

(54) SOFT DECODING OF THE FLOQUET CODES

(71) Applicant: Microsoft Technology Licensing, LLC, Redmond, WA (US)

(72) Inventors: Nicolas Guillaume Delfosse, Seattle, WA (US); Marcus Palmer da Silva, Redmond, WA (US); Yue Wu, New Haven, CT (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 210 days.

(21) Appl. No.: 18/515,490

(22) Filed: Nov. 21, 2023

(65) Prior Publication Data

US 2025/0165840 A1 May 22, 2025

(51) Int. Cl.
| | |
|---|---|
| *G06N 10/70* | (2022.01) |
| *G06N 10/20* | (2022.01) |
| *H03M 13/00* | (2006.01) |
| *H03M 13/11* | (2006.01) |

(52) U.S. Cl.
CPC ............. *G06N 10/70* (2022.01); *G06N 10/20* (2022.01); *H03M 13/1111* (2013.01); *H03M 13/611* (2013.01)

(58) Field of Classification Search
CPC ... G06N 10/70; G06N 10/20; H03M 13/1111; H03M 13/611
See application file for complete search history.

(56) References Cited

U.S. PATENT DOCUMENTS

| | | | | |
|---|---|---|---|---|
| 10,580,138 | B2 * | 3/2020 | Koehler | ................... G06T 7/13 |
| 10,608,663 | B2 * | 3/2020 | Gould | .................... H04L 27/34 |
| 2021/0049492 | A1 * | 2/2021 | Kim | ........................ G06F 30/20 |
| 2023/0027698 | A1 * | 1/2023 | Hastings | ............ H03M 13/1102 |

OTHER PUBLICATIONS

Connor T, et al., "Robust readout of bosonic qubits in the dispersive coupling regime." Physical Review A, vol. 98, Issue No. 2 Aug. 6, 2018, pp. 1-16.
Das, et al., "Afs: Accurate, fast, and scalable error-decoding for fault-tolerant quantum computers." In 2022 IEEE International Symposium on High-Performance Computer Architecture (HPCA), pp. 259-273.
Dennis, et al., "Topological Quantum Memory", In Journal of Mathematical Physics, vol. 43, Issue 9, Sep. 2002, pp. 4452-4505.
Eric, et al., "The correlated random walk." Journal of Applied Probability, vol. 18, Issue No. 2, 1981, pp. 403-414.

(Continued)

*Primary Examiner* — Mark D Featherstone
*Assistant Examiner* — Victor Perry
(74) *Attorney, Agent, or Firm* — Cantor Colburn LLP; Stephen A Wight

(57) ABSTRACT

Aspects of the disclosure include sending inputs according to the Floquet codes to be processed by a quantum circuit and receiving data streams from the quantum circuit, in response to the inputs. The data streams are encoded into a predetermined number of bits according to a probability density function for noise. The data streams are classified into hard outcomes having likelihoods of correctness, the hard outcomes representing output of the quantum circuit.

20 Claims, 16 Drawing Sheets

(56) References Cited

OTHER PUBLICATIONS

Fowler, et al., "Surface codes: Towards practical large-scale quantum computation," Physical Review A, vol. 86, Issue No. 3, Oct. 2012, 54 pages.

Gidney, et al., "Benchmarking the Planar Honeycomb Code", In Journal of Quantum, vol. 6, Sep. 14, 2022, pp. 1-18.

Gillis, J, et al., "Correlated random walk." In Mathematical Proceedings of the Cambridge Philosophical Society, vol. 51, Issue No. 4, Cambridge University Press, 1955, pp. 639-651.

Haah, et al., "Boundaries for the Honeycomb Code," Quantum, Apr. 18, 2022, 12 Pages.

Jacob, et al., "Single-shot number-resolved detection of microwave photons with error mitigation." Physical Review A, vol. 103, Issue No. 2, 2021, 16 pages.

Martinez A, et al., "Improving qubit readout with hidden Markov models." Physical Review A, vol. 102, Issue No. 6, Oct. 31, 2020, pp. 1-10.

Matthew B. Hastings, et al., "Dynamically Generated Logical Qubits", Quantum 5, 564, arXiv:2107.02194v2, Oct. 12, 2021, 19 pages.

Murphy, Kevin, "Machine Learning: A Probabilistic Perspective", In Publication MIT Press, Sep. 18, 2012, 1098 Pages.

Nicolas Delfosse, "Hierarchical decoding to reduce hardware requirements for quantum computing", arXiv:2001.11427v1, Jan. 30, 2020, 08 Pages.

Paetznick, et al., "Performance of Planar Floquet codes with Majorana-based Qubits", In PRX Quantum, vol. 4, Issue 1, Jan. 25, 2023, 15 Pages.

Pattison A, et al., "Improved quantum error correction using soft information." arXiv preprint arXiv:2107, Jul. 28, 2021, 27Pgaes.

Rabiner, Lawrence R., "A Tutorial on Hidden Markov Models and Selected Applications in Speech Recognition", In Proceedings of the IEEE, vol. 7, Issue 2, Feb. 1989, 30 pages.

Raussendorf, et al., "Fault-Tolerant Quantum Computation with High Threshold in Two Dimensions", In Journal of Physical Review Letters, vol. 98, Issue 19, May 11, 2007, 04 Pages.

Rui Chao et al: "Optimization of the Surface Code Design for Majorana-Based Qubits", In Repository of arXiv:2007.00307v2, Oct. 26, 2020, 19 Pages.

Shilin, et al., "Optimal signal processing for continuous qubit readout." Physical Review A, vol. 90, Issue No. 2, Aug. 6, 2014, pp. 1-8.

Smith, et al., "Local predecoder to reduce the bandwidth and latency of quantum error correction." Physical Review Applied, vol. 19, Issue No. 3, Sep. 13, 2023, 16 pages.

Soren, et al., "Past quantum states of a monitored system," Physical review letters, vol. 111, Issue No. 16, May 21, 2013, pp. 1-20.

Wu, et al., "Fusion Blossom: Fast MWPM Decoders for QEC", In Repository of arXiv:2305.08307v1, May 15, 2023, pp. 1-18.

International Search Report and Written Opinion received for PCT Application No. PCT/US2024/053480, mailed on Aug. 26, 2025, 16 Pages.

* cited by examiner

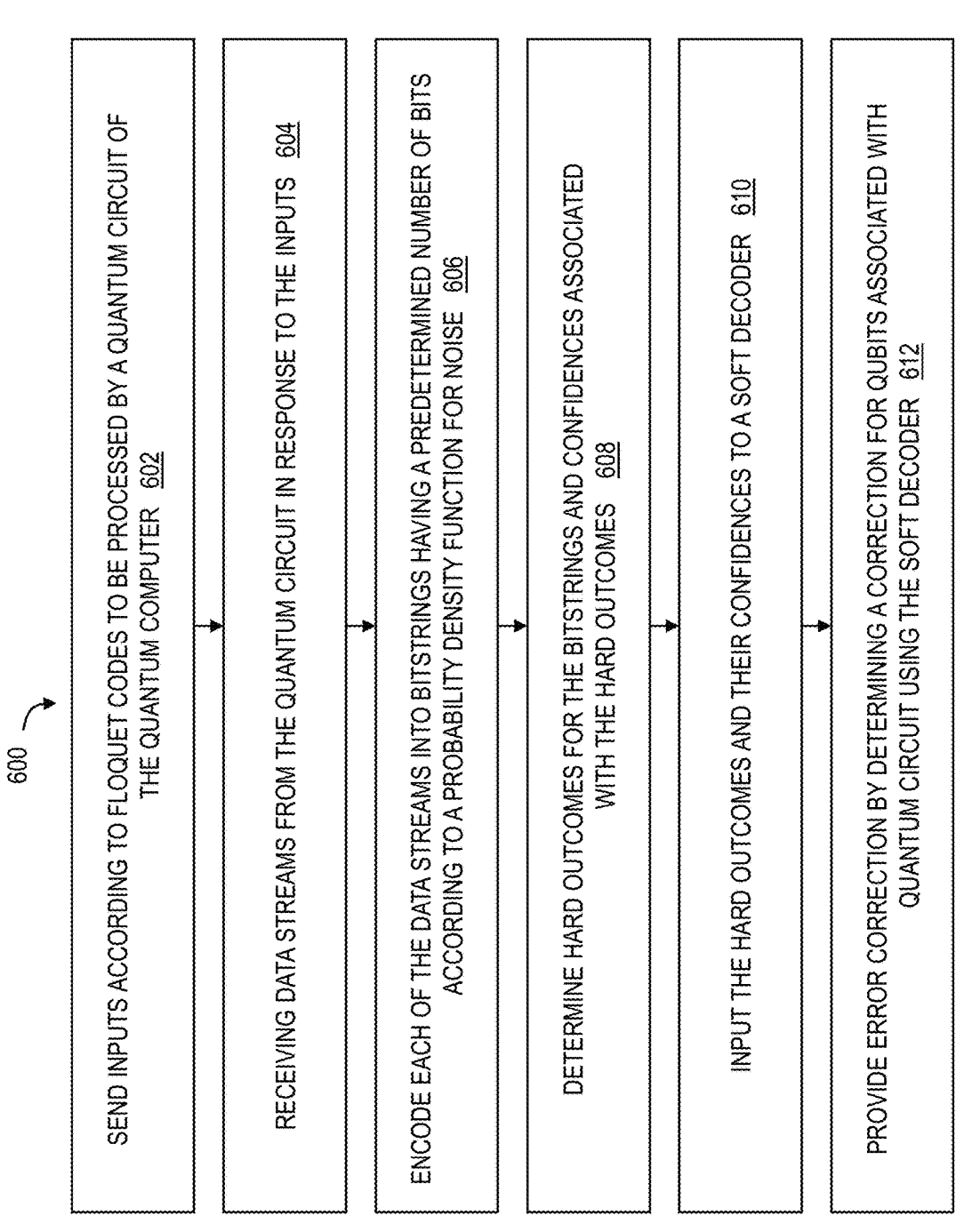

600

SEND INPUTS ACCORDING TO FLOQUET CODES TO BE PROCESSED BY A QUANTUM CIRCUIT OF THE QUANTUM COMPUTER  602

RECEIVING DATA STREAMS FROM THE QUANTUM CIRCUIT IN RESPONSE TO THE INPUTS  604

ENCODE EACH OF THE DATA STREAMS INTO BITSTRINGS HAVING A PREDETERMINED NUMBER OF BITS ACCORDING TO A PROBABILITY DENSITY FUNCTION FOR NOISE  606

DETERMINE HARD OUTCOMES FOR THE BITSTRINGS AND CONFIDENCES ASSOCIATED WITH THE HARD OUTCOMES  608

INPUT THE HARD OUTCOMES AND THEIR CONFIDENCES TO A SOFT DECODER  610

PROVIDE ERROR CORRECTION BY DETERMINING A CORRECTION FOR QUBITS ASSOCIATED WITH QUANTUM CIRCUIT USING THE SOFT DECODER  612

FIG. 6

TABLE 1

| code | threshold $p_{th}$ | | $p_{L,th}$ | |
|---|---|---|---|---|
| | hard | soft | hard | soft |
| toric honeycomb | 0.012 | 0.020 | 0.09 | 0.11 |
| planar honeycomb | 0.013 | 0.019 | 0.06 | 0.07 |
| toric square-octagon | 0.011 | 0.018 | 0.09 | 0.10 |
| planar square-octagon | 0.012 | 0.017 | 0.026 | 0.035 |

FIG. 8

500 steps 100 steps

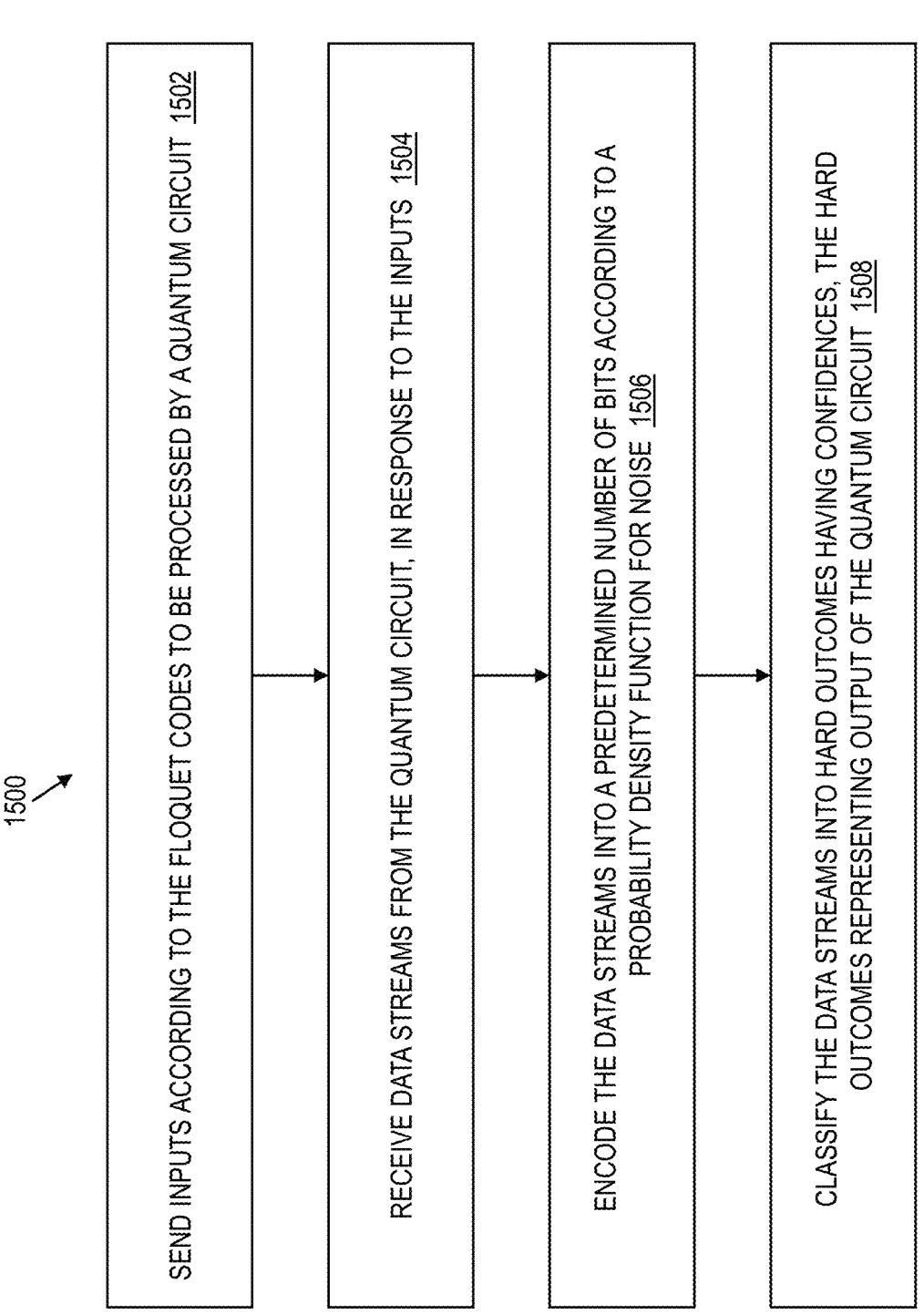

1500

SEND INPUTS ACCORDING TO THE FLOQUET CODES TO BE PROCESSED BY A QUANTUM CIRCUIT  1502

RECEIVE DATA STREAMS FROM THE QUANTUM CIRCUIT, IN RESPONSE TO THE INPUTS  1504

ENCODE THE DATA STREAMS INTO A PREDETERMINED NUMBER OF BITS ACCORDING TO A PROBABILITY DENSITY FUNCTION FOR NOISE  1506

CLASSIFY THE DATA STREAMS INTO HARD OUTCOMES HAVING CONFIDENCES, THE HARD OUTCOMES REPRESENTING OUTPUT OF THE QUANTUM CIRCUIT  1508

FIG. 15

SOFT DECODING OF THE FLOQUET CODES

INTRODUCTION

The subject disclosure relates to quantum circuits, and particularly to soft decoding of the Floquet codes.

A quantum computer is a physical machine configured to execute logical operations based on or influenced by quantum-mechanical phenomena. Such logical operations may include, for example, mathematical computation. Current interest in quantum-computer technology is motivated by analysis suggesting that the computational efficiency of an appropriately configured quantum computer may surpass that of any practicable non-quantum computer when applied to certain types of problems. Such problems include computer modeling of natural and synthetic quantum systems, integer factorization, data searching, and function optimization as applied to systems of linear equations and machine learning. Furthermore, it has been predicted that continued miniaturization of conventional computer logic structures will ultimately lead to the development of nanoscale logic components that exhibit quantum effects and should therefore be addressed according to quantum-computing principles.

Different types of quantum computers base their operation on different quantum-mechanical phenomena. A "topological" quantum computer is a quantum computer whose operation is based on a non-Abelian topological phase of matter that may support "braidable" quasiparticles. This type of quantum computer is expected to be less prone to the issue of quantum decoherence than other types of quantum computers, and may therefore serve as a relatively fault-tolerant quantum-computing platform.

SUMMARY

Embodiments of the present invention are directed to methods for providing soft decoding of the Floquet codes. A non-limiting example method includes sending inputs according to the Floquet codes to be processed by a quantum circuit and receiving data streams from the quantum circuit, in response to the inputs. The method includes encoding the data streams into a predetermined number of bits according to a probability density function for noise and classifying the data streams into hard outcomes having likelihoods of correctness, the hard outcomes representing output of the quantum circuit.

A non-limiting example system includes a memory, computer readable instructions, and a processor for executing the computer readable instructions. The computer readable instructions control the processor to perform operations including sending inputs according to the Floquet codes to be processed by a quantum circuit and receiving data streams from the quantum circuit, in response to the inputs. The processor performs operations including encoding the data streams into a predetermined number of bits according to a probability density function for noise and classifying the data streams into hard outcomes having likelihoods of correctness, the hard outcomes representing output of the quantum circuit.

Another non-limiting example system includes a quantum circuit, and a computer coupled to the quantum circuit and comprising a processor controlled to perform operations. The processor performs operations including sending inputs according to the Floquet codes to be processed by the quantum circuit and receiving data streams from the quantum circuit, in response to the inputs. The processor performs operations including encoding the data streams into a predetermined number of bits according to a probability density function for noise and classifying the data streams into hard outcomes having likelihoods of correctness, the hard outcomes representing output of the quantum circuit.

The above features and advantages, and other features and advantages of the disclosure are readily apparent from the following detailed description when taken in connection with the accompanying drawings. This Summary is provided to introduce in simplified form a selection of concepts that are further described in the Detailed Description. This Summary is not intended to identify key features or essential features of the claimed subject matter, nor is it intended to be used to limit the scope of the claimed subject matter. The claimed subject matter is not limited to implementations that solve any or all disadvantages noted in any part of this disclosure.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 6 depicts a flowchart of a computer-implemented method for soft decoding of Floquet codes in order to obtain additional and/or improved quantum measurements from a quantum circuit in accordance with one or more embodiments;

FIG. 8 depicts a Table illustrating simulations confirm an increase in a noise threshold in accordance with one or more embodiments;

FIG. 15 depicts a flowchart of a computer-implemented method for soft decoding Floquet codes in order to obtain additional and/or improved quantum measurements from a quantum circuit and to provide error correction for qubits in the quantum circuit, logical qubits, and/or software according to one or more embodiments.

Figure 1:
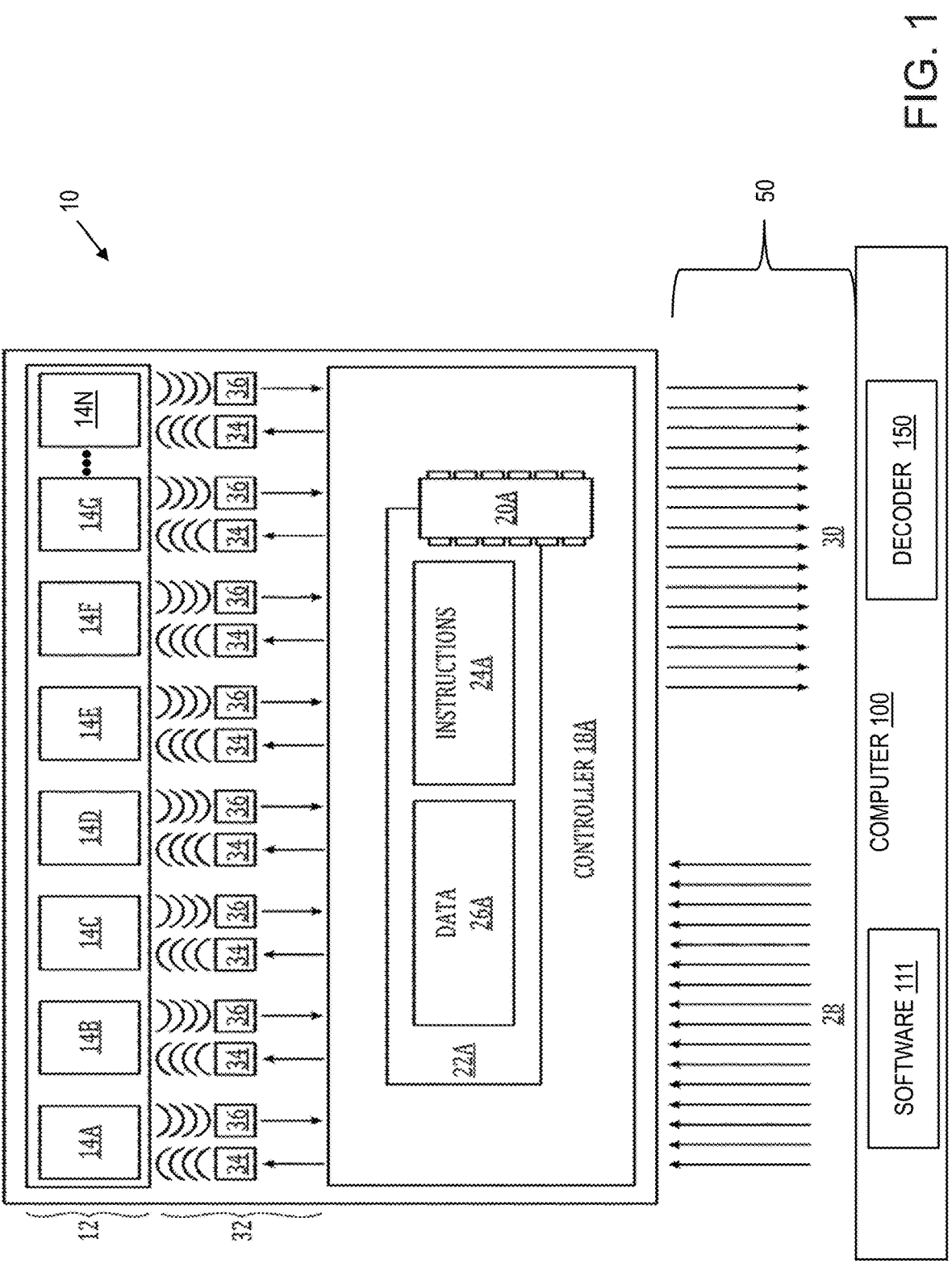
FIG. 1 depicts an example quantum computer configured to execute quantum-logic operations in accordance with one or more embodiments.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number corresponds to the figure in which its element is first illustrated.

DETAILED DESCRIPTION

In accordance with one or more embodiments, a system, method, and/or classical computer are configured and arranged to provide soft decoding of the Floquet codes. Quantum hardware is sensitive to noise, making quantum error correction an integral component of a large-scale quantum computer. To extract as much computational power as possible from the quantum hardware, one or more embodiments provide techniques to design quantum error correction schemes capable of exploiting all the information available about the errors affecting the quantum computer.

Soft decoders can improve the performance of surface code by incorporating all the measurement data in the decoder's decision instead of using only the discretized measurement outcomes ±1. The use of the soft decoder is even more relevant for the Floquet codes which are implemented (exclusively) with measurements. As discussed herein, one or more embodiments show a 45% improvement of the circuit-noise threshold of planar honeycomb codes using a soft decoder, which means that the honeycomb codes can tolerate 45% more noise when equipped with soft decoders, in accordance with one or more embodiments. For comparison, the surface code threshold improved by 5% using soft decoders without the disclosed technique. Below a noise threshold, one or more embodiments were able to obtain a 100 times improvement of the logical error rate for distance-9 honeycomb codes.

The tradeoff for integrating a soft decoder in a quantum computer is an increase in the bandwidth required to send all the measurement data to the decoder. In accordance with one or more embodiments, simulations were performed to explore the bandwidth requirements using a model for noisy quantum measurements where the outcome is a stream of data points. One or more embodiments disclose a technique that achieves the same performance as a soft decoder using a stream of 100 real values per measurement outcome, but using only six (6) bits of data extracted from each outcome stream. Further, one or more embodiments identify the optimal measurement duration as a function of the noise rate and the ratio between qubit noise and measurement outcome noise.

To optimize performance on any quantum computing platform, the circuits have to be adapted to the capabilities of the hardware. This is particularly true for error correction schemes, which are to be tailor-made to exploit the strengths of a given hardware platform. Unlike most other qubits, topological qubits employ a measurement-based scheme, where direct measurements between adjacent qubits are the native set of operations. While quantum error correction schemes use frequent measurements to identify errors, the state-of-the-art schemes require complex multi-qubit measurements that are not implemented directly in the hardware and have to be compiled into native operations at the expense of additional auxiliary qubits and additional timesteps. The outcomes of these measurements are used to infer the occurrence of errors without destroying the encoded quantum state.

Recent breakthroughs are able to overcome this issue through a conceptually new perspective on quantum codes, where the encoding of the quantum information is not static but rather allowed to periodically evolve in time. The study of such systems falls under the term Floquet systems, which gives this new class of codes its name. The Floquet codes are built from two-qubit measurements referred to as "check measurements." Just like measurements in a conventional code, these are used to check for errors. The simplicity of these checks, however, means that each time one measures a check, one can change the encoding of the quantum information, leading to the Floquet nature of the code. As a consequence, the outcomes of these measurements cannot be used directly to infer which errors have occurred, but rather the full history of measurement outcomes over time is taken into account.

The Floquet codes can act as a fault-tolerant quantum memory by way of a time-ordered sequence of two-qubit Pauli measurements. Compared to the surface code, which is fundamentally constructed from four-qubit Pauli measurements, this obviates the need for compiling four-qubit Pauli measurements into either a sequence of two-qubit Clifford gates and single-qubit measurements, or one- and two-qubit Pauli measurements. The Floquet codes can be formulated on any face-three-colorable lattice and thus afford significant flexibility in the physical layout. A choice of lattice is the honeycomb lattice, although other lattices are possible.

The physical qubits are arranged in a lattice, with qubits on the vertices of a graph. Each check is associated with an edge of the graph, and one sequentially measures checks of different colors. The code state changes as the different checks are measured. There are several possible lattice arrangements of the qubits that allow for an implementation of a Floquet code. The lattices should have the following two properties: 1) each vertex should be attached to three edges; and 2) using only three colors, it should be possible to color the plaquettes in such a way that no adjacent plaquettes have the same color (that is, the plaquettes should be "three-colorable").

Quantum computing can utilize methods that suppress errors in faulty qubits. Quantum error correction is a broad class of techniques that encode "logical" qubits and gates in a subspace of the Hilbert space formed by many more "physical" qubits and gates. The structure of a quantum code has an influence on how logical gates are enacted on the physical qubits, and hence the total size and execution time of a quantum computation.

Figure 4:
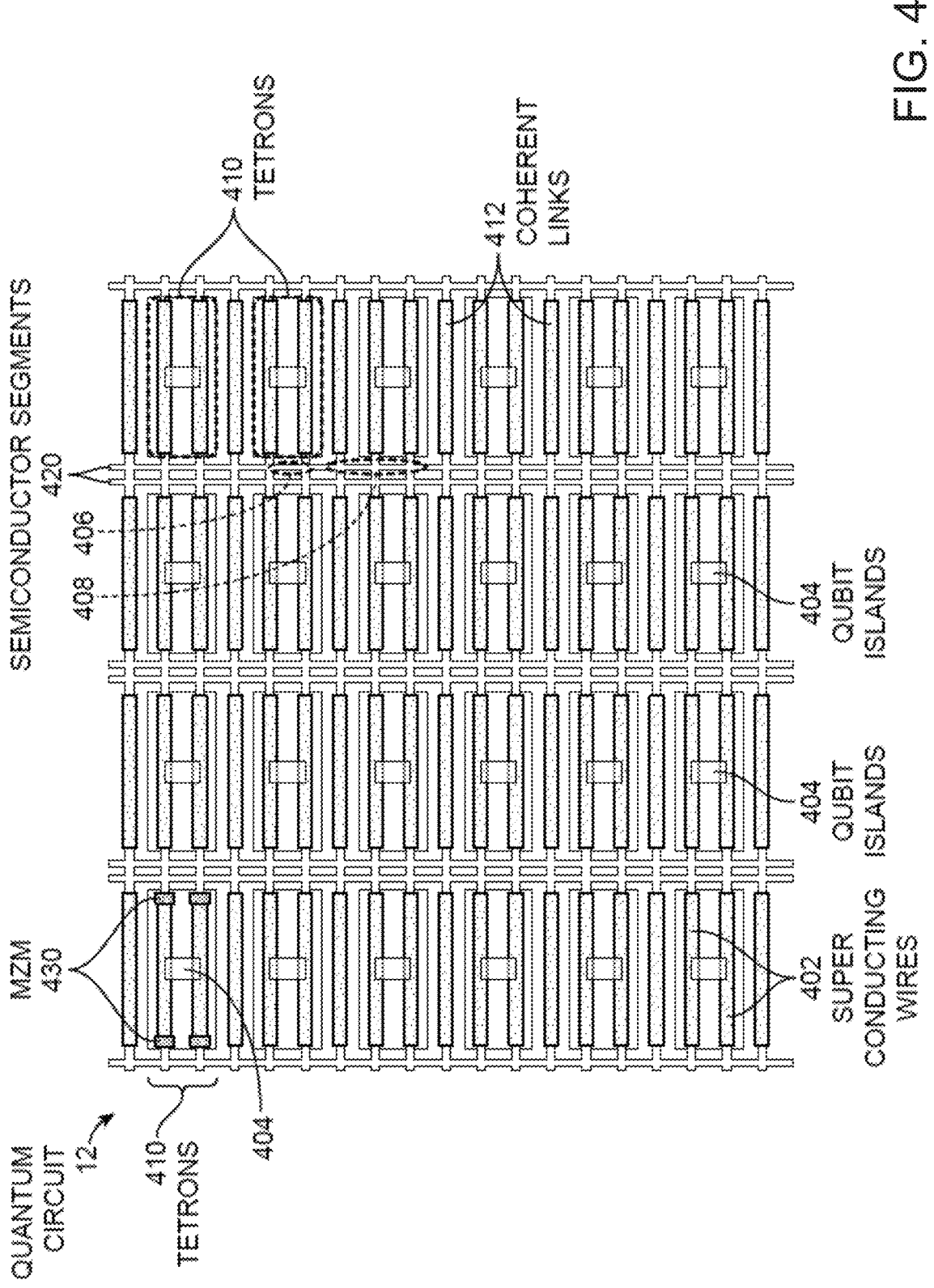
FIG. 4 depicts a layout of a quantum circuit in accordance with one or more embodiments.

Example Quantum Computer Architecture: FIG. 1 illustrates an example quantum computer 10 configured to execute quantum-logic operations. While conventional computer memory holds digital data in an array of bits and enacts bit-wise logic operations, a quantum computer holds data in an array of qubits and operates quantum-mechanically on the qubits in order to implement the desired logic. Accordingly, quantum computer 10 of FIG. 1 includes at least one quantum circuit 12 having an array of physical qubits 14A, 14B, and 14C-14N, where N is the last number of qubits. The qubits 14A-14N can be referred to collectively as qubits 14. The quantum circuit 12 of the array of qubits 14 can be arranged in a lattice structure as depicted in FIG. 4.

The qubits 14 of the quantum circuit 12 take various forms, depending on the desired architecture of the quantum computer 10. While this disclosure relates to qubits embodied as quasiparticles in a non-Abelian topological phase, a qubit alternatively can include: a superconducting Josephson junction, a trapped ion, a trapped atom coupled to a high-finesse cavity, an atom or molecule confined within a fullerene, an ion or neutral dopant atom confined within a host lattice, a quantum dot exhibiting discrete spatial- or spin-electronic states, electron holes in semiconductor junctions entrained via an electrostatic trap, a coupled quantum-wire pair, an atomic nucleus addressable by magnetic resonance, a free electron in helium, a molecular magnet, or a metal-like carbon nanosphere, as non-limiting examples. More generally, each qubit 14 can include any particle or system of particles that can exist in two or more discrete quantum states that can be measured and manipulated experimentally. For instance, a qubit may be implemented in the plural processing states corresponding to different modes of light propagation through linear optical elements (e.g., mirrors, beam splitters and phase shifters), as well as in states accumulated within a Bose-Einstein condensate.

Figure 2:
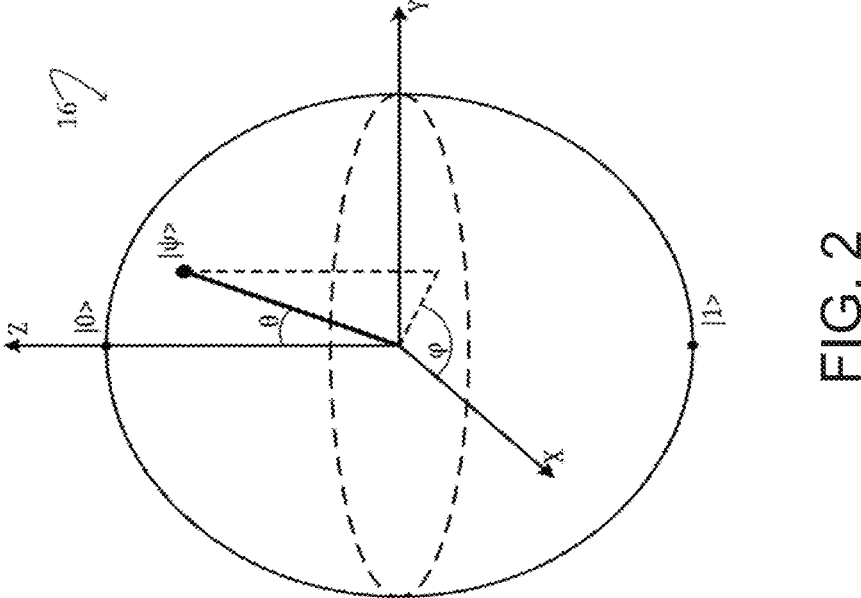
FIG. 2 depicts an illustration of a Bloch sphere that provides a graphical description of some quantum mechanical aspects of an individual qubit in accordance with one or more embodiments.

FIG. 2 is an illustration of a Bloch sphere 16 that provides a graphical description of some quantum mechanical aspects of an individual qubit 14. In this description, the north and south poles of the Bloch sphere correspond to the standard basis vectors |0> and |1>, respectively. The set of points on the surface of the Bloch sphere comprise all possible pure states |ψ> of the qubit, while the interior points correspond to all possible mixed states. A mixed state of a given qubit may result from decoherence, which may occur because of undesirable coupling to external degrees of freedom.

Referring to FIG. 1, quantum computer 10 includes a controller 18A. The controller 18A includes at least one processor 20A and associated computer memory 22A. The processor 20A of the controller 18A can be coupled operatively to peripheral componentry, such as network componentry, to enable the quantum computer to be operated remotely. The processor 20A of the controller 18A can take the form of a central processing unit (CPU), a graphics processing unit (GPU), or the like. As such, the controller can include classical electronic componentry. The terms "classical" and "non-quantum" are applied herein to any component that can be modeled accurately as an ensemble of particles without considering the quantum state of any individual particle. Classical electronic components include integrated, micro-lithographed transistors, resistors, and capacitors, for example. The computer memory 22A can be configured to hold program instructions 24A that cause the processor 20A to execute any function or process of the controller. The computer memory can also be configured to hold additional data 26A. In examples in which quantum circuit 12 is a low-temperature or cryogenic device, the controller 18A can include control componentry operable at low or cryogenic temperatures, for example, a field-programmable gate array (FPGA) operated at 77 kelvin (K). In such examples, the low-temperature control componentry can be coupled operatively to interface componentry operable at normal temperatures.

The controller 18A of the quantum computer 10 is configured to receive a plurality of inputs 28 and to provide a plurality of outputs 30 to classical computer 100. The inputs and outputs can each include digital and/or analog lines in a network 50. At least some of the inputs and outputs can be data lines through which data is provided to and/or extracted from the quantum computer. Other inputs can include control lines via which the operation of the quantum computer can be adjusted or otherwise controlled. In one or more embodiments, the quantum computer 10 can be coupled to a classical computer 100. Further, details of the example computer 100 are discussed in FIG. 16.

The controller 18A is operatively coupled to the quantum circuit 12 via quantum interface 32. The quantum interface 32 is configured to exchange data bidirectionally with the controller 18A. The quantum interface 32 is further configured to exchange signal corresponding to the data bidirectionally with the qubit register. Depending on the architecture of quantum computer 10, such signal may include electrical, magnetic, and/or optical signal. By the signal conveyed through the quantum interface 32, the controller 18A can interrogate and otherwise influence the quantum state held in various qubits 14. For example, the controller 18A can interrogate and otherwise influence the quantum state held a qubit register, as defined by a collective quantum state of a group of qubits 14. The quantum interface 32 includes at least one modulator 34 and at least one demodulator 36, each coupled operatively to one or more qubits 14 of the quantum circuit 12. In one or more embodiments, a modulator 34 and a demodulator 36 can each be coupled to qubits in a qubit register. Each modulator 34 is configured to output a signal to one or more qubits 14 in the quantum circuit 12 based on modulation data received from the controller 18A. In one or more embodiments, at least one modulator 34 can output a signal to qubits in a qubit register based on modulation data received from the controller 18A. Each demodulator 36 is configured to sense a signal from the one or more qubits 14 of the quantum circuit 12 and to output data to the controller 18A based on the signal. In one or more embodiments, each demodulator 36 is configured to sense a signal from the qubit register and to output data to the controller 18A based on the signal. The data received from the demodulator 36 can, in some examples, be an estimate of an observable to the measurement of the quantum state held in one or more qubits 14 in the quantum circuit 12. In one or more embodiments, the data received from the demodulator 36 can be an estimate of an observable to the measurement of the quantum state held in the qubit register.

In some examples, the modulator 34 can transmit a suitably configured signal to interact physically with one or more qubits 14 of the quantum circuit 12 in order to trigger measurement of the quantum state held in one or more qubits 14. The demodulator 36 can then sense a resulting signal released by the one or more qubits 14 pursuant to the measurement and can provide the data corresponding to the resulting signal to the controller 18A. Stated another way, the demodulator 26 is configured to output, based on the signal received, an estimate of one or more observables reflecting the quantum state of one or more qubits of the qubit register, and to furnish the estimate to the controller 18A. In one non-limiting example, the modulator 34 can provide, based on data from the controller 18A, an appropriate voltage pulse or pulse train to an electrode of one or more qubits 14, to initiate a measurement. In short order, the demodulator 36 can sense photon emission from the one or more qubits 14 and can assert a corresponding digital voltage level on a quantum-interface line into the controller 18A. Generally speaking, any measurement of a quantum-mechanical state is defined by the operator "O" corresponding to the observable to be measured; the result "R" of the measurement is guaranteed to be one of the allowed eigenvalues of "O". In the quantum computer 10, "R" is statistically related to the qubit-register state prior to the measurement but is not uniquely determined by the qubit-register state.

Pursuant to appropriate input from the controller 18A, the quantum interface 32 may be configured to implement one or more quantum-logic gates to operate on the quantum state held in the quantum circuit 12, for example, in a qubit register in the quantum circuit 12. While the function of each type of logic gate of a classical computer system is described according to a corresponding truth table, the function of each type of quantum gate is described by a corresponding operator matrix. The operator matrix operates on (i.e., multiplies) the complex vector representing the qubit register state and effects a specified rotation of that vector in Hilbert space.

For example, the Hadamard gate HAD is defined by $$HAD = \frac{1}{\sqrt{2}}\begin{bmatrix} 1 & 1 \\ 1 & -1 \end{bmatrix}. \tag{A}$$

The HAD gate acts on a single qubit; it maps the basis state |0> to (|0>)/√2, and maps to |1> to (|0>−|1>)√2. Accordingly, the HAD gate creates a superposition of states that, when measured, have equal probability of revealing |0> or |1>.

The phase gate S is defined by $$S = \begin{bmatrix} 1 & 0 \\ 0 & e^{i\pi/2} \end{bmatrix}. \tag{B}$$

The S gate leaves the basis state |0> unchanged but maps |1> to $e^{i\pi/2}$|1>. Accordingly, the probability of measuring either |0> or |1> is unchanged by this gate, but the phase of the quantum state of the qubit is shifted. This is equivalent to rotating ψ by 90 degrees along a circle of latitude on the Bloch sphere of FIG. 2.

Some quantum gates operate on two or more qubits. The SWAP gate, for example, acts on two distinct qubits and swaps their values. This gate is defined by $$SWAP = \begin{bmatrix} 1000 \\ 1010 \\ 0100 \\ 0001 \end{bmatrix}. \tag{C}$$

The foregoing list of quantum gates and associated operator matrices is non-exhaustive, but is provided for ease of illustration. Other quantum gates include Pauli-X, -Y, and -Z gates, the $\sqrt{NOT}$ gate, additional phase-shift gates, the $\sqrt{SWAP}$ gate, controlled cX, cY, and cZ gates, and the Toffoli, Fredkin, Ising, and Deutsch gates, as non-limiting examples.

Figure 3:
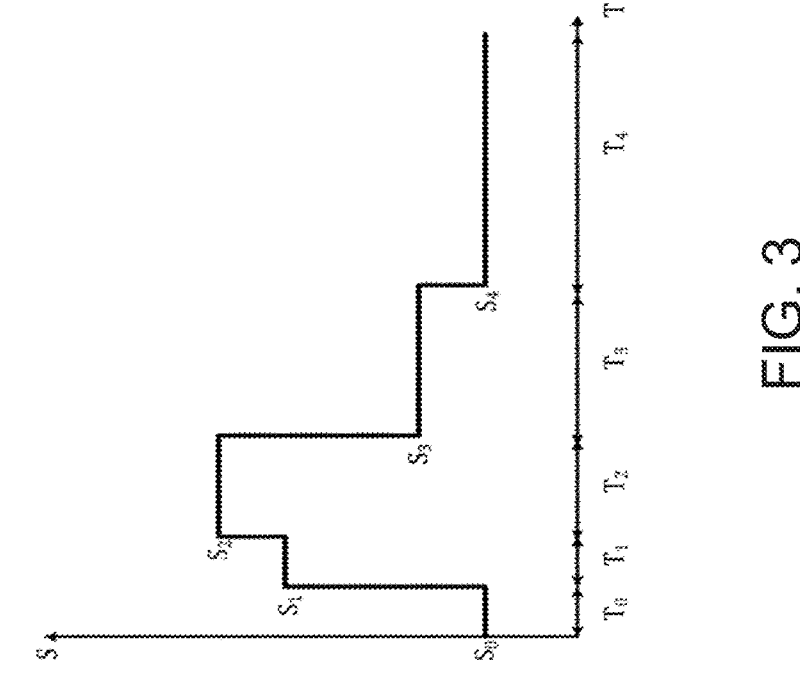
FIG. 3 is a graph of example signal levels associated durations to assert a quantum-gate operation on one or more qubits of a quantum circuit in accordance with one or more embodiments.

Continuing in FIG. 1, suitably configured signal from modulators 34 of the quantum interface 32 can interact physically with one or more qubits 14 of the quantum circuit 12, for example, a qubit register in the quantum circuit 12, so as to assert any desired quantum-gate operation. As noted above, the desired quantum-gate operations are specifically defined rotations of a complex vector representing the qubit register state. In order to effect a desired rotation "O", one or more modulators of quantum interface 32 can apply a predetermined signal level $S_i$ for a predetermined duration $T_i$. In some examples, plural signal levels can be applied for plural sequenced or otherwise associated durations, as depicted in FIG. 3, to assert a quantum-gate operation on one or more qubits of the quantum circuit 12, for example, in a qubit register of the quantum circuit 12. In general, each signal level $S_i$ and each duration $T_i$ is a control parameter adjustable by appropriate programming of controller 18A.

The term 'oracle' is used herein to describe a predetermined sequence of elementary quantum-gate and/or measurement operations executable by quantum computer 10. An oracle can be used to transform the quantum state of qubits 14 in the quantum circuit 12, for example, qubits in a qubit register, to effect a classical or non-elementary quantum-gate operation or to apply a density operator, for example. In some examples, an oracle may be used to enact a predefined 'black-box' operation $f(x)$, which may be incorporated in a complex sequence of operations. To ensure adjoint operation, an oracle mapping n input qubits |x> to m output or ancilla qubits |y>$f(x)$ may be defined as a quantum gate 0 (|x>⊗|y>) operating on the n+m qubits. In this case, O can be configured to pass the n input qubits unchanged but combine the result of the operation $f(x)$ with the ancillary qubits via an XOR operation, such that O (\x>⊗t>)=x>⊗|y+ $f(x)$>. As described further below, a state-preparation oracle is an oracle configured to generate a quantum state of specified qubit length.

Implicit in the description herein is that each qubit 14 of qubit registers can be interrogated via quantum interface 32 so as to reveal with confidence the standard basis vector |0> or |1> that characterizes the quantum state of that qubit. In some implementations, however, measurement of the quantum state of a physical qubit could be subject to error. Accordingly, any physical qubit 14 can be implemented as a logical qubit, which includes a grouping of physical qubits measured according to an error-correcting oracle that reveals the quantum state of the logical qubit with confidence.

Topological Quantum Computer: In a topological quantum computer, the quantum state held in each qubit is a state of two or more braidable quasiparticles, or "anyons", observed within a non-Abelian topological phase of matter. The world lines of different anyons are quantum mechanically forbidden from intersecting or merging. This feature forces their paths to form stable braids that pass around each other in space-time. Relative to trapped particles used in other types of quantum computers, anyon braids are more resistant to quantum decoherence, which is a source of error in quantum computation. However, the realization of a topological quantum computer has the ability to engineer a suitable topological phase and to manipulate the anyons therein.

Early experiments in topological quantum computing focused on the two-dimensional 'electron gas' of a super-cooled, thin layer of gallium arsenide (GaAs) sandwiched between layers of aluminum gallium arsenide (AlGaAs) and manipulated in a strong magnetic field. Implementation of a quantum computer using that architecture includes the braiding of individual quasiparticle excitations combined with anyonic interferometry-based measurement, involving coherent quasiparticle transport over significant distances.

Proposed more recently is a one-dimensional topological qubit architecture that is more amenable to practical implementation. The proposed system uses a semiconductor-superconductor heterostructure wherein superconductivity, strong spin-orbit coupling, and magnetic fields cooperate to form a topological, superconducting state that supports Majorana zero modes (MZMs). This architecture obviates the need to move quasiparticles by employing a "measurement-only" method wherein a sequence of measurements has the same effect as a braiding operation. This architecture does not require quasiparticles to be moved through an interferometry loop, but rather exploits a distinction between a "fermion parity-protected topological phase" (the actual genus of the proposed heterostructure) and a true topological phase. Advantageously, topological charge in a fermion parity-protected topological phase can be manipulated by the process of electron tunneling into a MZM. Transport through a pair of MZMs can provide a measurement of their combined topological charge in the presence of a large charging energy.

In view of these and other useful properties, MZMs can be used as a basis for the qubits of a topological quantum computer. The MZMs are created at the ends of semiconductor-superconductor heterostructures tuned into a topological regime by the appropriate magnetic field and gate voltages. A series of practical implementations are described in Karzig et al., *Scalable Designs for Quasiparticle-Poisoning-Protected Topological Quantum Computation with Majorana Zero Modes*, arXiv: 1610.05289v4 [cond-mat.mes-hall] 21 Jun. 2017. Suitable heterostructure materials and material properties are described in Lutchyn et al., *Majorana Fermions and a Topological Phase Transition in Semiconductor-Superconductor Heterostructures*, arXiv: 1002.4033v2 [cond-mat.supr-con] 13 Aug. 2010. The entirety of both of the above references is hereby incorporated by reference herein, for all purposes.

Example implementations include at least two topological superconducting segments in a qubit, totaling at least four Majorana zero modes per qubit. The states used for quantum computation is the degenerate ground states of the qubit, in contrast to non-degenerate quantum-computing architectures where the two states of the qubit have different energies. The degeneracy of the qubit states and the spatial separation of the Majorana zero modes ensure long coherence times and feasibility of precise application of a set of Clifford gates.

FIG. 4 illustrates an example layout of a square lattice of tetrons used to implement a honeycomb and 4.8.8 Floquet codes. In FIG. 4, topological superconducting wires 402 have a MZM at both ends. Qubit islands 404 correspond to two parallel topological superconducting wires 402 joined by a trivial superconducting backbone, with MZMs 430 labeled according to the box in the upper left. MZMs 430 are illustrated for a single tetron 410 but applies to all of the tetrons 410. Rows of tetrons 410 are separated by coherent links 412, which are floating topological wires. Neighboring qubit islands 404 are connected by semiconducting segments 420, with two semiconducting columns of semiconducting segments 420 separating each column of qubit islands 404. There are also rows of semiconductor regions connected the semiconductor segments 420 to coherent links 412 and superconducting wire 402. The coherent links 412 do not have the qubit islands 404. The superconducting wires 402 connect to qubit islands 404, which are the physical qubits 14 in the quantum circuit 12. Since the physical qubits 14 are arranged in an array, the qubit islands 404 are in columns. A semiconductor segment 406 can be referred to as length-1 semiconductor quantum dot with gate defined. A semiconductor segment 408 can be referred to as length-2 semiconductor quantum dot with gate defined.

Each tetron 410 in FIG. 4 includes a physical qubit, where the qubit islands 404 are the physical qubits 14. The tetron 410, which encompasses a qubit island 404, can be referred to as a physical qubit. In the example square lattice as at least a portion of the quantum circuit 12, there is an array of 6*4=24 tetrons displayed, each representing a physical qubit. As seen in FIG. 4, the MZM 430 appears at the end of each topological superconducting wire 402. A quartet of MZMs 430 forms a logical qubit, where each tetron 410 has two topological superconducting wires 402, and each wire has two MZMs 430. Altogether each tetron 410 has 4 MZMs which includes one physical qubit, for example, physical quit 14.

The Hastings-Haah code is measurement code for logical qubits, and the measurements are performed using plaquettes. The Hastings-Haah code is based on a honeycomb lattice. As noted herein, the instructions 24A cause measurements on the quantum circuit 12 using the modulators 34 and demodulators 36. A measurement of one or more physical qubits 14 is the result of sending a signal via the modulator 34 and receiving a signal back via the demodulator 36. The received signal, also referred to as the measurements, has the quantum information about the logical qubit that is formed of two or more physical qubits 14. Based on a signal sent and the received signal from the quantum circuit 12, a logical qubit is formed of two or more physical qubits 14 as understood by one of ordinary skill in the art. The various signals sent and corresponding signals received back can be performed using the scheme or code that follows/adheres to plaquettes, as understood by one of ordinary skill in the art.

Figures 5A, 5B, 5C, 5D, 5E, 5F:
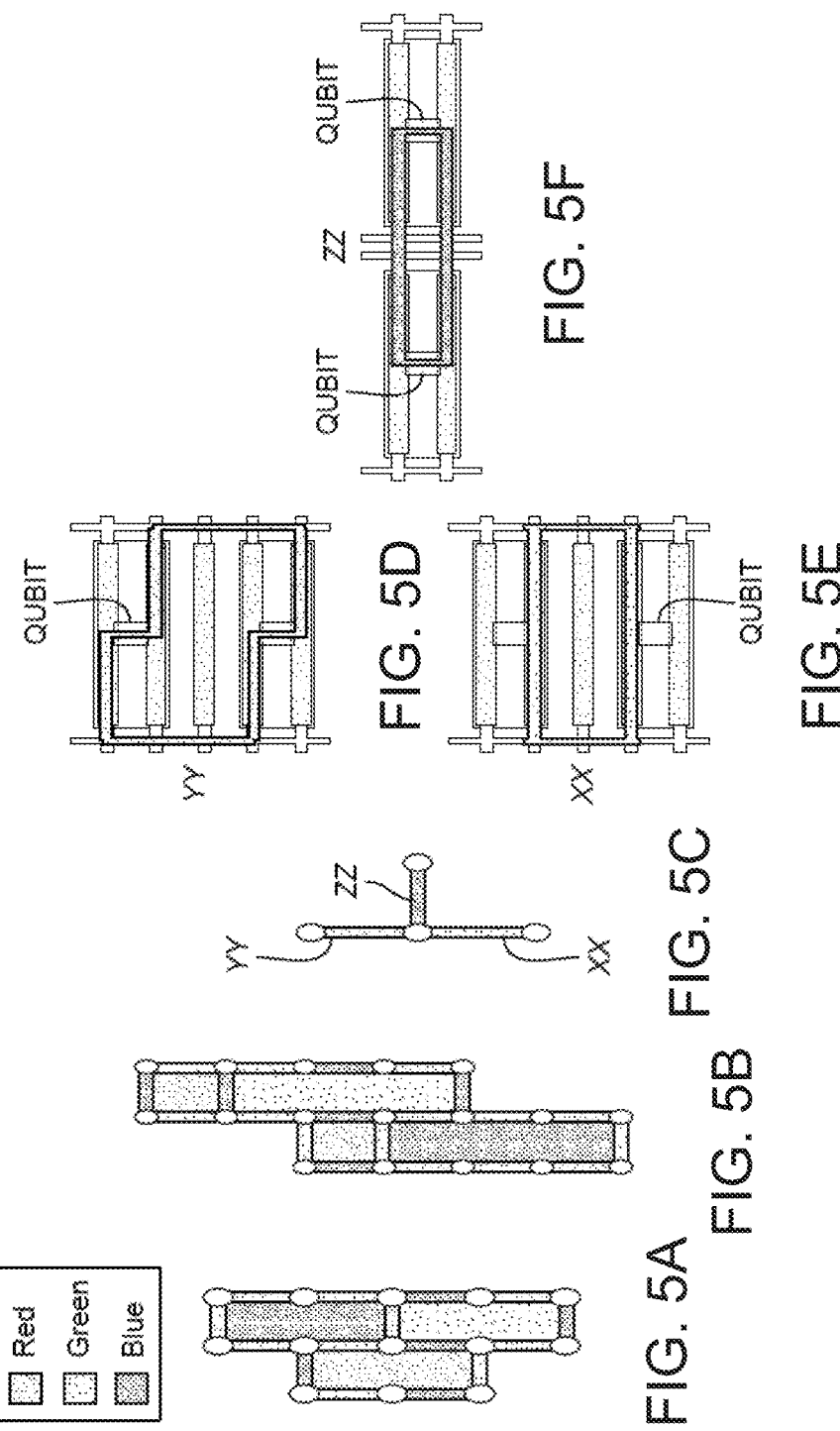
FIG. 5A depicts a vertical brick wall unit of a honeycomb lattice in accordance with one or more embodiments.
FIG. 5B depicts a vertical brick wall unit of the 4.8.8 lattice in accordance with one or more embodiments.
FIG. 5C depicts the directions for XX, YY, and ZZ measurements in accordance with one or more embodiments.
FIG. 5D depicts example bulk YY measurements in accordance with one or more embodiments.
FIG. 5E depicts example bulk XX measurements in accordance with one or more embodiments.
FIG. 5F depicts example bulk ZZ measurements in accordance with one or more embodiments.

Some examples of measurements are illustrated in FIGS. 5A, 5B, 5C, 5E, and 5F. FIG. 5A illustrates a vertical brick wall unit of a honeycomb lattice. FIG. 5B illustrates a vertical brick wall unit of the 4.8.8 lattice. FIG. 5C illustrates the directions for XX, YY, and ZZ measurements. FIG. 5D illustrates example bulk YY measurements. FIG. 5E illustrates example bulk XX measurements. FIG. 5F illustrates example bulk ZZ measurements. Colors are represented in FIGS. 5A, 5B, 5C, 5D, 5E, and 5F. The colors refer to the measurement time steps, rather than the Pauli operators. It is noted that the different colors describe the 3-coloring of the plaquettes and corresponding checks. The honeycomb and 4.8.8 lattices map to the tetron array of tetrons 410 of the quantum circuit 12 in FIG. 4 using vertical bricks such that each 2n-gon corresponds to a rectangle of height n. With this mapping, the honeycomb and 4.8.8 Floquet codes in the bulk use a subset of the highest fidelity two-qubit measurements: XX and YY measurements between vertically adjacent qubit islands in FIGS. 5E and 5D respectively, and ZZ between horizontally adjacent qubit islands in FIG. 5F. To implement measurements on neighboring pairs of vertically adjacent qubits without their corresponding loops intersecting, the two columns of semiconductor segments 420 separating each column of qubit islands 404, which are the qubits 14, can be utilized.

A published paper of a layout of the 4.8.8 Hastings-Haah code using Majorana based architectures has been presented in by Adam Paetznick, Christina Knapp, Nicolas Delfosse, Bela Bauer, Jeongwan Haah, Matthew B. Hastings, and Marcus P. da Silva, in *Performance of planar floquet codes with majorana-based qubits*, PRX Quantum, 4:010310, Jan. 25, 2023, which is herein incorporated by reference.

The Hastings-Haah code is implemented in the instructions 24A in the quantum computer 10. In one or more embodiments, the Hastings-Haah code can be implemented as computer-executable instructions in the classical computer 100 and sent to the quantum computer 10 for execution. As understood by one of ordinary skill in the art, Hastings-Haah code denotes a technique of operating the 2D array of qubits 14 in the quantum circuit 12. Moreover, the Hastings-Haah code is a sequence of two qubit measurements on the quantum circuit 12 of the quantum computer 10, and the classical computer 100 eventually stores those measurement outcomes. That sequence of two qubit measurements is programmed into the classical computer 100, which then sends signals to the quantum computer 10, indicating which operations to perform on the quantum circuit 12.

FIG. 6 is a flowchart of a computer-implemented method 600 for soft decoding of Floquet codes in order to obtain additional and/or improved quantum measurements from a quantum circuit in accordance with one or more embodiments. By obtaining additional and/or improved quantum measurements from the quantum circuit 12 of the quantum computer 10, one or more embodiments provide quantum error correction schemes capable of exploiting all the information available about the errors affecting the quantum computer 10 can be utilized for error correction. Also, the soft decoding technique for Floquet codes can tolerate 45% more noise in the quantum computer. The computer-implemented method 900 can be executed on the classical computer 100 coupled to the quantum computer 10 in order to generate and receive measured outcomes from the qubits 14 of the quantum circuit 12. Reference can be made to any of the figures discussed here.

At block 602 of the computer-implemented method 600, the software 111 of computer 100 is configured to send inputs 28 according to Floquet codes to be processed by the quantum circuit 12 of the quantum computer 10. Individual inputs inputs 28 sent to the quantum computer 10 can include a sequence of quantum gates and measurements.

At block 604 of the computer-implemented method 600, the software 111 is configured to receive data streams back from the quantum circuit 12 of the quantum computer 10 in response to the inputs 28. The quantum circuit 12 of the quantum computer 10 generates measurement data, such as output 30, for each measurement implemented. The measurement data is a data stream that may be referred to herein as an emission sequence, for example, an emission sequence $\alpha_0, \alpha_1, \ldots, \alpha_T$. There can be multiple rounds of measurement data (e.g., multiple rounds of outputs 30) generated by the quantum circuit 12 and sent to the computer 100, where each round has its own data stream.

Figures 10A, 10B:
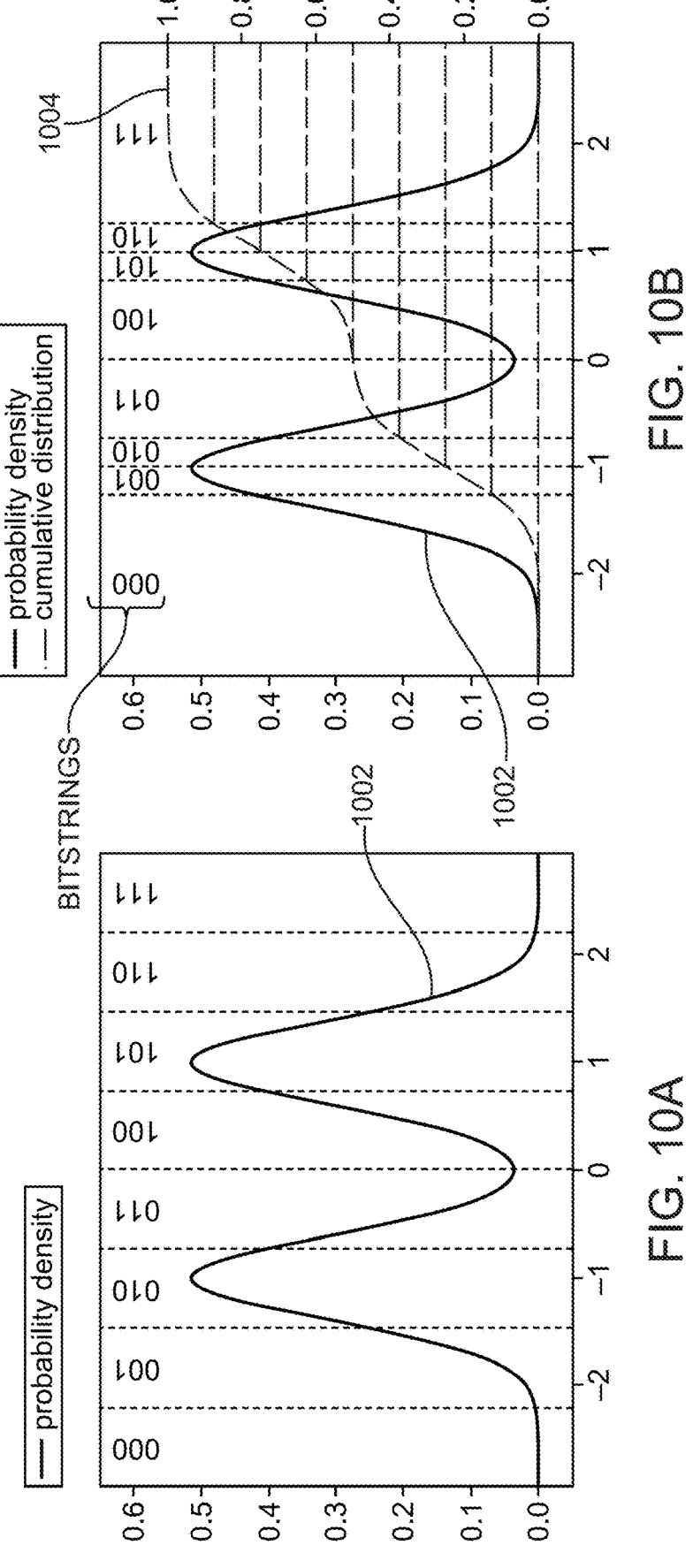
FIG. 10A depicts a graph of an example probability density function for noise of the quantum circuit, where the probability density function is split into equal intervals in accordance with one or more embodiments.
FIG. 10B depicts a graph of the example probability density function for noise of the quantum circuit, where the probability density function is split into unequal intervals having an equal probability of occurring in accordance with one or more embodiments.

At block 606 of the computer-implemented method 600, the software 111 is configured to encode each of the data streams into bitstrings having a predetermined number of bits according to a probability density function for noise of the quantum circuit. FIG. 10A depicts a graph of an example probability density function 1002 for noise of the quantum circuit, where the probability density function 1002 is split into equal intervals in which each interval has a different value. FIG. 10B depicts a graph of the example probability density function 1002 for noise of the quantum circuit, where the probability density function 1002 is split into unequal intervals in which each unequal interval has an equal probability of occurring according to one or more embodiments. In FIG. 10B, the probability density function 1002 has been truncated according to the cumulative distribution function 1004 such that the intervals are unequal. In FIG. 10B there are 8 unequal intervals depicted and each unequal interval is assigned a value for a predetermined number of bits, which are 3 bits for explanation purposes, although 6 bits of precision are determined to be sufficient according to one or more embodiments. After encoding a data stream, the data stream is represented by a bitstring of the predetermined number of bits (e.g., 3 bits shown in FIG. 10B). This data stream is the information measured such as current, voltage, etc. The data stream is a random stream of data. There are two possible sources for the randomness, which is either random of type 0 or random of type 1. The type is the measurement outcome that is to be extracted.

Furthermore, the software 111 encodes each emission sequence using only a few bits (e.g., predetermined number of bits). In one or more embodiments, this is done by considering only the last outcome $\alpha_T$ of the sequence and compressing it in b bits (with b=6 in the example case but other values of b can be utilized for other codes). To do this compression, the software 111 splits the set of all possible values for $\alpha_T$ into $2^b$ intervals with equal probabilities and assigns a bitstring with b bits with each unequal interval.

At block 608 of the computer-implemented method 600, the software 111 is configured to determine hard outcomes for the bitstrings and likelihoods of correctness (e.g., confidences) associated with the hard outcomes. The software 111 is configured to classify the predetermined number of bits of a bitstring representing a data stream into hard outcome. Hard outcomes for the data stream can be +1 or -1 according to which unequal interval the predetermined number of bits fall into in the probability density function of noise.

In one or more embodiments, the software 111 can call, be integrated with, and/or include a classifier to determine the hard outcome. There can be two classifiers utilized which are the memoryless classifier and/or backward-forward classifier. The memoryless classifier uses only the last value $\alpha_T$ (its compressed version) of the emission sequence and maps the last value $\alpha_T$ onto +1 if $\alpha_T{>}0$ and −1 if $\alpha_T{<}0$. More generally, the software 111 can precompute the most likely value +1 or −1 for each bitstring and use this to extract the hard outcome +1 or −1, based on the classification of the memoryless classifier along with a confidence score. For the memoryless classifier, the (predetermined number of) bits in the bitstring denoting a data stream have been encoded to represent the last value $\alpha_T$ of the emission sequence.

In one or more embodiments, the backward-forward classifier (algorithm) uses the whole sequence $\alpha_0, \alpha_1, \ldots, \alpha_T$ to compute the probability of +1 and the probability of −1 given the sequence observed and the hard outcome returned is the one with the largest probability, along with a confidence score. It is determined that the simpler classifier, memoryless classifier, performs almost as well as the backward-forward classifier but with a lot less data which allows for bandwidth reduction. For the backward-forward classifier, the (predetermined number of) bits in the bitstring denoting a data stream have been encoded to represent the all values of the emission sequence $\alpha_0, \alpha_1, \ldots, \alpha_T$.

Furthermore, using the classifier, for each measurement (e.g., for each data stream), the software 111 extracts two pieces of information: the hard outcome +1 or −1, and the likelihood of being correct or confidence associated with the hard outcome.

At blocks 610 and 612 of the computer-implemented method 600, the software 111 is configured to input the hard outcomes and their likelihoods of correctness (e.g., confidences) to a soft decoder 150 and receive the error correction by using the soft decoder 150 to determine an error correction for qubits associated with the quantum circuit. The software 111 can call, be integrated with, and/or include a soft decoder 150.

A soft decoder or a soft-decision decoder is a kind of decoding method in which an algorithm is used to decode data that has been encoded with an error correcting code. In contrast, a hard decoder or hard-decision decoder operates on data that takes on a fixed set of possible values (typically 0 or 1 in a binary code), whereas the inputs to a soft decoder may take on a whole range of values in-between. This extra information indicates the reliability of each input data point and is used to form better estimates of the original data. Therefore, a soft decoder typically performs better in the presence of corrupted data than its hard decoder counterpart.

Examples of suitable soft decoders include a soft minimum weight perfect matching (MWPM) decoder and a soft Union-Find (UF) decoder discussed in U.S. Pat. No. 11,521, 104 and in Nicolas Delfosse et al., *Improved Quantum Error Correction Using Soft Information*, arXiv: 2107.13589 [quant-ph] 28 Jul. 2021, the contents of which are incorporated herein by reference.

Using the hard outcomes (for the data streams received from the quantum circuit 12) and their likelihood of correctness (e.g., confidences), the soft decoder 150 is controlled to provide a correction to apply to the (physical) qubits 14 and/or to the logical qubits. The software 111 can cause the error correction to be implemented in hardware and/or in software in the computer 100. The soft decoder 150 can output error solution information that identifies fault locations (e.g., locations of quantum bit flips) for a readout device in the quantum interface 32. Using the error solution information that identifies fault locations, the software 111 can cause error correction to be performed on the computer 100, to be performed by the controller 18A, etc., thereby improving the computer 100 and/or the quantum computer 10.

Headings are presented in the descriptions for ease of understanding and to assist the reader. The headings are not meant to be limiting. The term experimenters may be utilized to denote the inventors. Various experiments and simulations may be discussed for explanation purposes, and one or more embodiments are not meant to be limited to exact details disclosed in the experiments and simulations.

I. Introduction

A. The Floquet Codes

The surface code is appealing for qubits equipped with native controlled NOT (CNOT) gates because they are capable of efficiently executing the syndrome extraction circuit of the surface code, which is made of one round of preparation of ancilla qubits, four rounds of CNOT gates, and one round of measurement of the ancilla qubits. Implementing the surface code with other types of qubits, such as measurement-based qubits, may be more challenging and could lead to a degraded performance. An alternative is to use the Floquet codes, which are easy to implement using (exclusively) joint measurements. It was shown that they can outperform surface codes for measurement-based qubits.

Attention may be directed to the honeycomb codes and the square-octagon codes (e.g., toric and planar). Discussion below is for the toric honeycomb code, and it is noted that the square-octagon code is defined similarly. Different boundary conditions can be considered to make these honeycomb and square-octagon codes planar. The simulations of this paper are based on the constructions as described in Adam Paetznick, Christina Knapp, Nicolas Delfosse, et al, *Performance of planar Floquet codes with Majorana-based qubits*, arXiv preprint arXiv: 2202.11829, 2022.

The toric honeycomb code is defined by placing qubits on the vertices of a hexagonal lattice of the torus with 3-colored edges. Its syndrome extraction circuit is made of the sequence: measure XX on red edges, measure YY on green edges, and measure ZZ blue edges. Like in the surface code, this sequence is repeated d times to correct measurement outcome faults. This number of repetition is equal to the code distance d in one or more embodiments.

These measurement outcomes of the toric honeycomb code are combined to extract the outcomes of the measurements of the operators $X^6$ on green-blue faces, $Y^6$ on blue-red faces, and $Z^6$ on red-green faces. For example, the outcome of the measurement of $X^6$ along a green-blue face is the parity of the outcomes of the measurements YY and ZZ supported on the 6 edges of this face. Because the face operators commute with all the joint measurements of the circuit, the outcome of the face operators should be preserved in the absence of faults. Faults are corrected using the syndrome bits obtained by comparing two consecutive outcomes of the same face operator. Each syndrome bit is the parity of 12 measurement outcomes.

Figure 7:
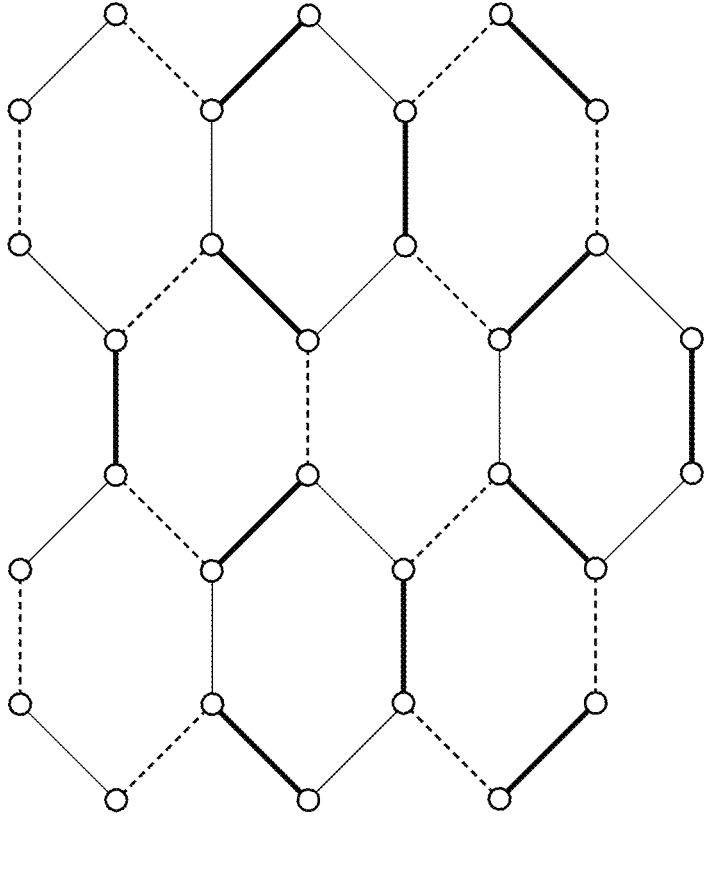
FIG. 7 depicts an example of quantum error correction with the honeycomb code performed on qubits placed on the edges of a hexagon lattice using a sequence of joint measurements on the edges of the lattice in accordance with one or more embodiments.

FIG. 7 depicts an example of quantum error correction with the honeycomb code performed on qubits placed on the edges of a hexagon lattice using a sequence of joint measurements on the edges of the lattice: XX on red edges, YY on green edges, and ZZ on blue edges.

B. Circuit-Noise Model With Soft Measurements

The standard circuit-noise model assumes that each circuit operation is followed by a uniform non-trivial random Pauli error acting on its support with some probability p. For measurements, each outcome 0 or 1 is flipped independently with probability p. Here, the experimenters adopted the more general soft noise model, which goes beyond the binary outcome setting. A soft measurement is defined by a pair of probability density functions (pdf) $f^{(0)}$ or $f^{(1)}$. In the absence of noise, measuring a Pauli operator P for a system in the state $|\psi\rangle$ produces an outcome $\tilde{\mu} \in \{0,1\}$ that is referred to as the ideal outcome. The ideal outcome is the random variable such that the following is expressed:

$$\mathbb{P}_{P,|\psi\rangle}(\tilde{\mu}) = \left\| \frac{I + (-1)^{\tilde{\mu}} P}{2} |\psi\rangle \right\|^2. \tag{Eq. 1}$$

The ideal outcome $\tilde{\mu}$ cannot be observed. Instead, one obtains a value $\mu$, the so-called soft outcome, sampled from the distribution with pdf $f^{(\tilde{\mu})}$. The soft outcome lives in any probability space and is typically not in $\{0,1\}$. One can think of soft outcome as an element of $\mathbb{R}$ or $\mathbb{R}^N$ for some integer N. Based on the soft outcome and the knowledge of the two pdfs, one can identify the most likely ideal outcome $\hat{\mu}$ that the experimenters call hard outcome. The experimenters say that a hard flip occurs if $\hat{\mu}$ is not equal to the ideal outcome.

In the simulations, the experimenters used soft measurements defined by two normal distributions with standard deviation $\sigma$ centered in $\pm 1$ as described in Christopher A Pattison, Michael E Beverland, et al., *Improved quantum error correction using soft information*, arXiv: 2107.13589, 2021, which is hereby incorporated by reference herein. The probability of a hard flip with this Gaussian soft noise is denoted $\rho_h$ ($\sigma$) and is given by the following.

$$p_h(\sigma) = \frac{1}{\sigma\sqrt{2\pi}} \int_{-\infty}^{0} e^{\frac{-(\mu-1)^2}{2\sigma^2}}. \tag{Eq. 2}$$

The standard deviation $\sigma$ such that this probability is equal to q is denoted $\theta_h$ (q). To summarize, a circuit-noise model is considered with Gaussian soft measurements, denoted CNGSM ($\rho_u$, $\rho_m$, $\rho_f$), defined as follows. (1) Each unitary circuit operation is followed by a Pauli error with probability $\rho_u$. The error is selected uniformly among the non-trivial Pauli errors acting on the support of the circuit operation. (2) Each measurement is followed by a Pauli error with probability $\rho_m$. The error is selected uniformly among the non-trivial Pauli errors acting on the measured qubits. (3) The outcome of a measurement is the soft outcome $\mu \in \mathbb{R}$ obtained by sampling from normal distribution $\mathcal{N}((-1)^{\tilde{\mu}}, \sigma_h(\rho_f))$ where $\tilde{\mu}$ is the ideal outcome.

The example circuit is made with a sequence of 3d rounds of joint measurements, and simulations included an additional 6 rounds of noiseless joint measurements at the end of the circuit to check for residual errors and estimate the logical error rate. The simulations used the model CNGSM ($\rho$, $\rho/2$, $\rho/2$). Unitary gates have noise rate $\rho$, and measurements include two sources of noise with rate $\rho/2$.

II. Performance of Floquet Codes with Soft Decoders

A. Improvement of the Threshold and the Logical Error Rate

Figure 9:
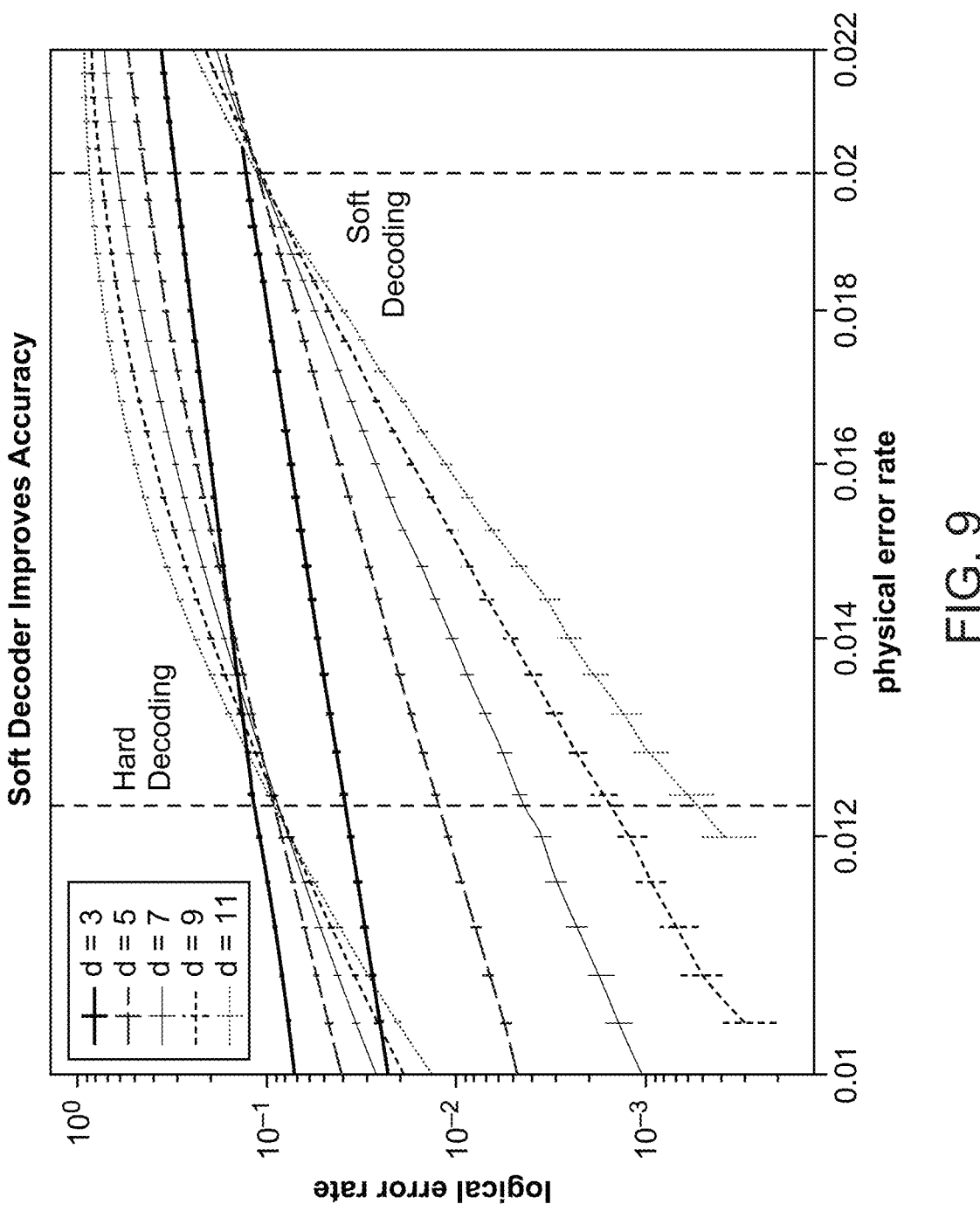
FIG. 9 depicts a graph illustrating a reduction of a logical error rate in the low noise rate regime using a soft decoder for toric honeycomb codes in accordance with one or more embodiments.

The Floquet codes can be decoded using the soft version of the minimum weight perfect matching (MWPM) decoder or the Union-Find (UF) decoder as discussed in discussed in U.S. Pat. No. 11,521,104 and in Nicolas Delfosse et al.,

*Improved Quantum Error Correction Using Soft Information*, arXiv: 2107.13589 [quant-ph] 28 Jul. 2021. In the simulation, experimenters used the fusion-blossom implementation of the MWPM decoder. In the case of surface codes, previous results show that the use of soft information leads to an improvement of the performance in the low-noise rate regime and a minor increase of the threshold for circuit-noise (from 0.70% to 0.73%). According to one or more embodiments, the experimenters determined that soft decoders are even more relevant for the Floquet codes because of the central role of measurements in these schemes. The simulations confirm this intuition with a noise threshold increasing from 1.2% to 2% for the toric honeycomb code, as depicted in Table 1 in FIG. 8. FIG. 9 depicts a graph illustrating a clear reduction of the logical error rate in the low noise rate regime using a soft decoder for toric honeycomb codes. For the distance-9 surface code, the experimenters observed a 100 times reduction of the logical error rate.

The following heuristic provides a rough estimate of the logical error rate $\rho_L(\rho)$ of the Floquet codes for the noise model CNGSM ($\rho$, $\rho/2$, $\rho/2$) in the below-threshold regime.

$$p_L(p) = p_{L,th}\left(\frac{p}{p_{th}}\right)^{\frac{d+1}{2}}. \tag{Eq. 3}$$

The constants $\rho_{L,th}$ and the thresholds $\rho_{th}$ are given in Table 1 for the planar and toric honeycomb codes and for the planar and toric square-octagon Floquet codes. Table 1 in FIG. 8 is a comparison of the threshold of the Floquet codes with hard and soft MWPM decoders. In the regime of low noise rate, the logical error rate of these codes can be estimated using Eq. 3 based on the data in Table 1. This provides a convenient way to estimate the logical error rate of these four codes with hard and soft decoders.

B. The Precision Versus Accuracy Tradeoff

The main obstacle to the integration of a soft decoder in a quantum computer architecture is the vast amount of data the soft decoder consumes. It is estimated that running Shor's algorithm to factor a 2,048 bit integer would require 7 terabits/second (Tbit/s) of bandwidth to communicate the hard measurement outcomes to the decoder. The bandwidth required to execute Floquet codes which are implemented exclusively with joint measurements is even larger. Assuming that one uses honeycomb codes to encode 10,000 logical qubits with distance 27, during each round of measurement, each logical patch executes more than $3d^3$ joint measurements in parallel. Considering a measurement time of 1 μs and supposing that each measurement produces a 16 bit soft outcome, then the total bandwidth is 350 Tbit/s. In general, the bandwidth required for quantum error correction with honeycomb codes is given by the following.

$$\frac{K \cdot 3d^3 \cdot s_{meas}}{t_{meas}} \tag{Eq. 4}$$

The bandwidth determined using Eq. 4 is in bit per second, where K is the number of logical qubits, d is the code distance, $t_{meas}$ is the measurement time in seconds, and $s_{meas}$ is the number of bits generated to describe the outcome of a single measurement.

In Section III, the experimenters considered a more realistic model where each measurement produces a stream of data, leading to even more significant bandwidth challenges.

If it is assumed that each measurement uses a stream of 10 data points, each encoded in 16 bits, the bandwidth required jumps to 3.5 petabits/second (Pbit/s).

Different (lossless) compression strategies tailored to the surface code have been attempted. One can also use a predecoder such as the lazy decoder to reduce the bandwidth requirement.

As discussed herein, the experimenters explored the effect of truncating the soft outcome to a fixed precision, according to one or more embodiments. Ultimately, using a single bit of precision would be equivalent to using a hard decoder. The goal is to minimize the number of bits of precision while preserving most of the performance of the soft decoder.

The experimenters assumed that the ideal outcome is a uniform random bit so that the probability density function (PDF) of the soft outcome is $(f^{(0)}+f^{(1)})/2$. The naive solution would be to equally discretize the soft outcome within some chosen bound, for example, a bound of $5\sigma$ as depicted in a graph in FIG. 10A. An alternative depicted in a graph in FIG. 10B is to truncate based on the cumulative distribution function (CDF) such that each discretized symbol has the same probability of happening, according to one or more embodiments. This is done by an equal discretization of the y-axis in the CDF graph depicted in FIG. 10B.

Figures 10C, 10D:
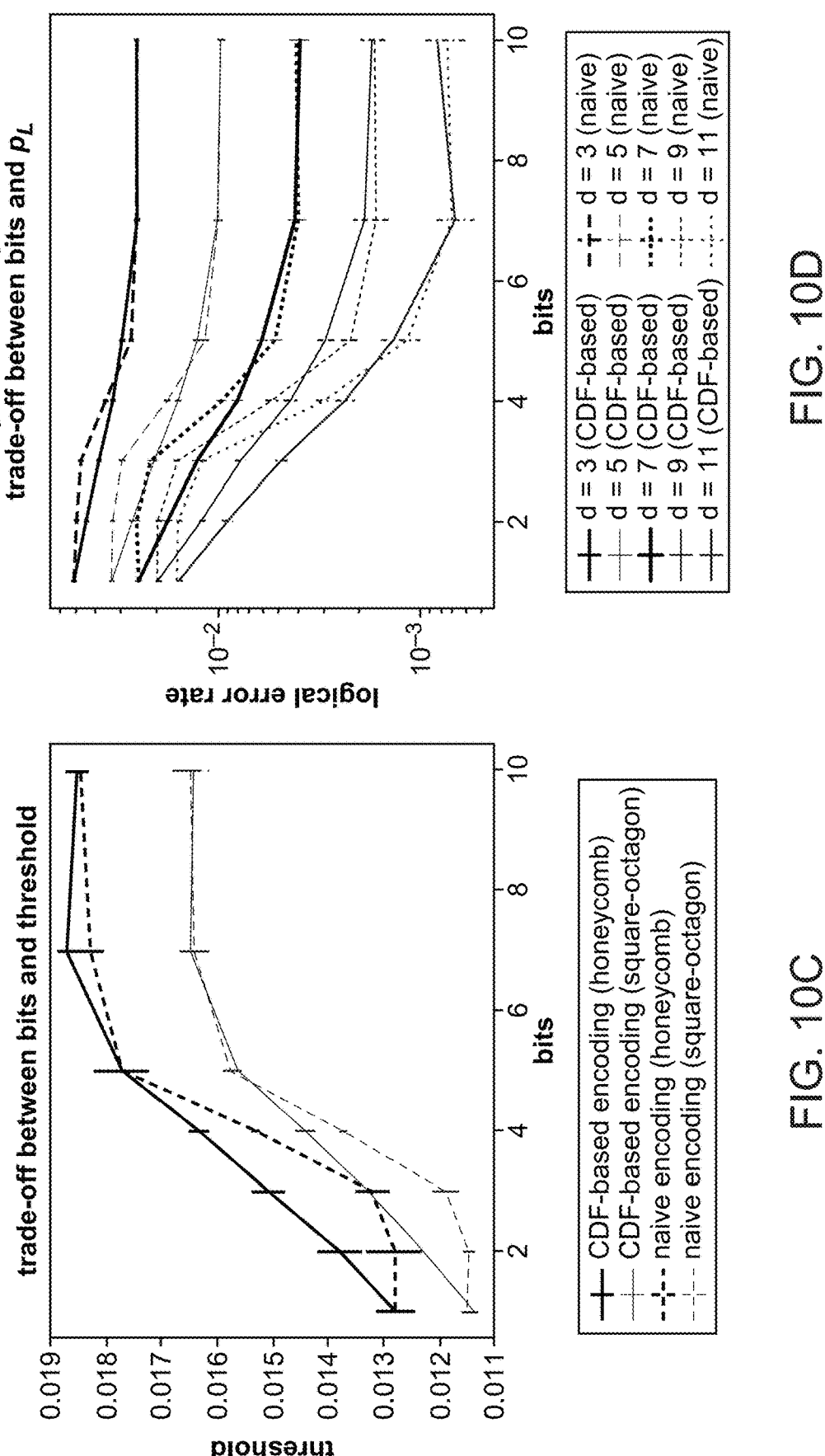
FIG. 10C depicts a graph of a threshold to tolerate noise as a function of the number of bits or precision of the soft outcome in accordance with one or more embodiments.
FIG. 10D depicts a graph of logical error rate as a function of the number of bits or precision of the soft outcome in accordance with one or more embodiments.

According to one or more embodiments, the simulations in a graph in FIG. 10C prove that six (6) bits of precision are enough to preserve most of the performance of the soft decoder in the threshold regime and in the low noise-rate regime. In FIG. 10C, the CDF-based encoding of the soft outcome provides a slightly better threshold than the naive encoding of soft outcomes.

Moreover, FIG. 10A depicts a graph of naive encoding of the soft outcome. FIG. 10B depicts a graph of optimized encoding of the soft outcome according to one or more embodiments. FIG. 10C depicts a graph of the threshold to tolerate noise as a function of the number of bits or precision of the soft outcome according to one or more embodiments. FIG. 10D depicts a graph of logical error rate as a function of the number of bits or precision of the soft outcome according to one or more embodiments. As can be seen, six bits of precision are sufficient to achieve the same performance of the soft decoder with unlimited precision.

III. The Emission Model for Noisy Quantum Measurements

Instead of a single soft outcome, it is more realistic to assume that a (single) quantum measurement produces a stream of measurement data for the duration of the measurement. In this section, the experimenters propose an emission model for quantum measurements, producing a discrete stream of noisy data from which the measurement outcome must be extracted. The example measurement model also includes noise affecting the quantum state during the measurement. To keep the model simple and efficient for simulation, the model is restricted to Pauli noise on the qubits. The measurement model can be described by a Hidden Markov Model. It should be appreciated that there are more general models where qubit noise is described by completely positive (CP) maps.

Described below are the emission model and the example of the Gaussian emission model that were use in the simulations. The experimenters designed two classifiers to identify the measurement outcome from the observed data stream and analyzed the performance and the bandwidth requirements of Floquet codes equipped with these two classifiers and with a soft decoder. The inventors investigated and determined the optimal measurement time for Floquet codes, which is the measurement time that minimizes the logical error rate of Floquet codes.

A. Definition of the Emission Model

Considered is the measurement of a w-qubit Pauli operator P for some integer w. A T-step emission for the measurement of P is a sequence $(\alpha_0, |\psi_0\rangle)$, $(\alpha_1, |\psi_1\rangle)$ . . . , $(\alpha_T, |\psi_T\rangle)$ where $\alpha_i \in \mathbb{R}N$, for some integer N and $|\psi_t\rangle$ is a quantum state. The measurement apparatus returns the sequence $\alpha_0, \alpha_1, \ldots \alpha_T$ that the inventors refer to as the emission sequence. The quantum state of the system remains unknown, and it is $|\psi_T\rangle$ at the end of this T-step measurement.

To define a T-step emission, the following parameters are provided: $|\psi\rangle$: the quantum state before measurement; $\rho_e \in [0,1]$: the noise rate per emission; $\tau_t$: the shift profile which is a sequence in $\mathbb{R}^N$; and $\mathcal{N}$: an emission-noise distribution over $\mathbb{R}^N$.

The initial state is defined by $\alpha_0 = 0 \in \mathbb{R}^N$ and $$|\psi_0\rangle = \frac{I + (-1)^{\tilde{\mu}_0} P}{2}|\psi\rangle$$

where $\tilde{\mu}_0 \in \{0,1\}$ is the ideal outcome with distribution $\mathbb{P}_{P,|\psi\rangle}$ defined in Eq. 1. During the measurement, the quantum state suffers from Pauli noise and is updated as follows.

$$|\psi_t\rangle = \begin{cases} |\psi_{t-1}\rangle & \text{with probability } 1 - p_e \\ E_t|\psi_{t-1}\rangle & \text{with probability } p_e \end{cases} \qquad \text{(Eq. 5)}$$

In the quantum state before measurement $|\psi\rangle$, $E_t$ is a uniform non-trivial Pauli error acting on the measured qubits. The classical state at evolves as follows.

$$a_{t+1} = a_t + (-1)^{\tilde{\mu}_t}\tau_t + v_t \qquad \text{(Eq. 6)}$$

For the classical state at of Eq. 6, $v_t$ is a random vector sampled from the emission-noise distribution $\mathcal{N}$, and $\tilde{\mu}_t \in \{0,1\}$ is the ideal outcome of the measurement of P for the quantum state $|\psi v_t\rangle$. This ideal outcome is deterministic and can be obtained from $\tilde{\mu}_0$ by flipping this bit each time one of the Pauli error $E_1, \ldots, E_t$ that occurs anti-commutes with P.

It is immediate to generalize this model to include a noise rate per emission $$p_e^{(\tilde{\mu})},$$

a shift profile $$\tau_t^{(\tilde{\mu})},$$

and an emission noise distribution $\mathcal{N}^{(\tilde{\mu})}$, which depends on the ideal outcome $\tilde{\mu}=0$ or 1 of the current state $|\psi_t\rangle$.

In following, the simplest shift $\tau_t=+1$ is considered. However, $\tau_t$ can be chosen so that the emission sequence is supported on an arbitrary parametric curve in $\mathbb{R}^N$ (plus some noise $\mathcal{N}$) to make it representative of a specific device.

B. The Gaussian Emission Model

Figures 11A, 11B:
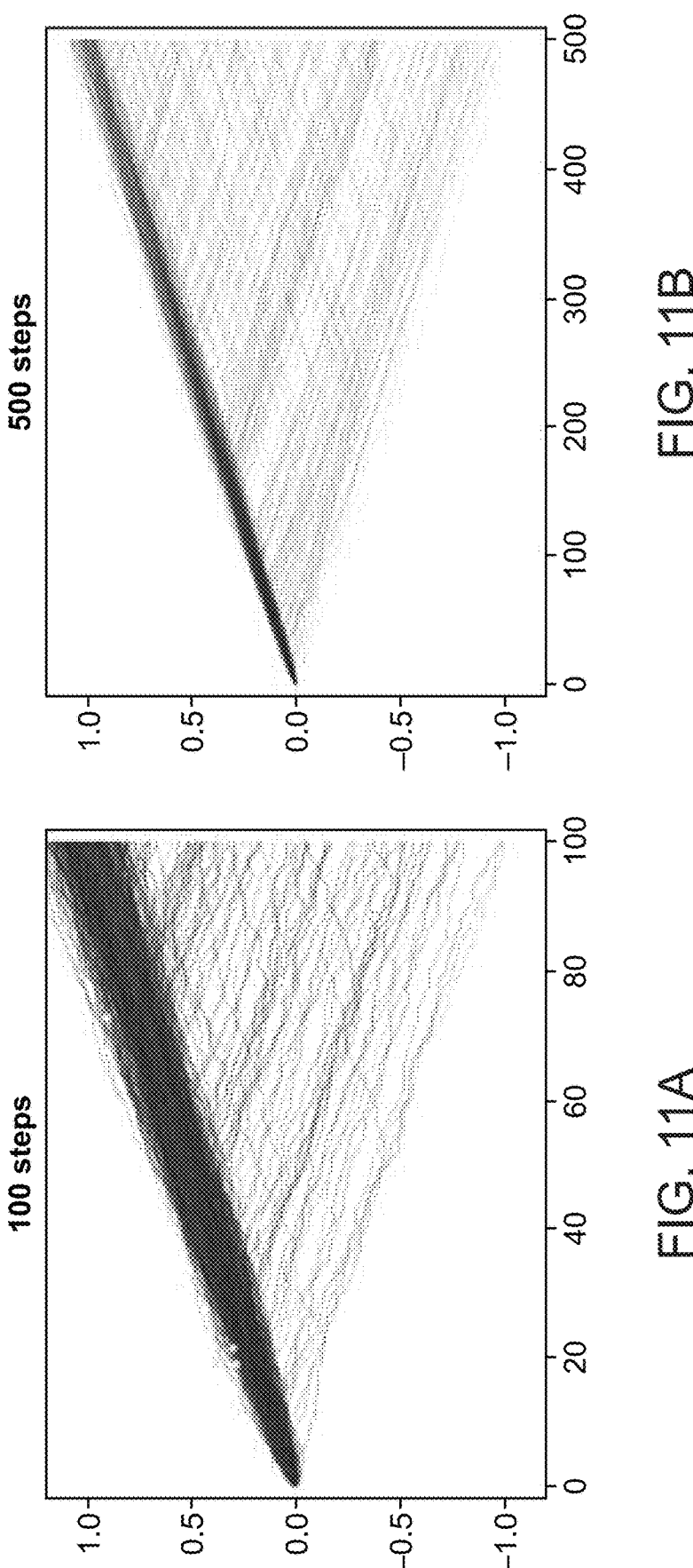
FIG. 11A depicts an example Gaussian emission sequence in accordance with one or more embodiments.
FIG. 11B depicts an example Gaussian emission sequence in accordance with one or more embodiments.

To make the model CNGSM more realistic, the inventors replaced the soft measurement model with an emission model. A one-dimensional (N=1) Gaussian emission model was used, which is defined by the shift profile $\tau_t=+1$ and the emission noise is a normal distribution N $(0, \sigma_e)$. FIGS. 11A and 11B depict examples of Gaussian emissions sequences produced with a Gaussian emission model, where FIG. 11A has 100 steps and FIG. 11B has 500 steps.

The circuit-noise model with Gaussian emission measurements, denoted $\mathrm{CNGEM}(\rho_u, \rho_e, \sigma_e)$, is defined as follows: (1) Each unitary circuit operation is followed by a Pauli error with probability $\rho_u$. The error is selected uniformly among the non-trivial Pauli errors acting on the support of the circuit operation. (2) The outcome of a T-step measurement is an emission sequence $\alpha_0, \alpha_1, \ldots, \alpha_T$ from a Gaussian emission model with noise rate $\rho_e$ per emission and standard deviation de for the emission noise.

The noise associated with unitary operations is the same as in CNGSM but the measurement noise is more general. The Gaussian emission model lets one vary the duration T of the measurements. If the circuit includes unitary gates or idle steps, it is reasonable to assume that their noise rate $\rho_u$ is proportional with the duration of the operation.

If only the last emission $\alpha_T$ is used, the Gaussian emission model is equivalent to a mixture of Gaussian soft noise models. It is convenient to describe this mixture using the correlated random walk model. A correlated random walk with parameters $q \in [0,1]$ is a random sequence $(W_t)_{t \in N}$, starting $W_0=0$ and with direction $d_0=+1$, such that, before each step, the direction $d_t$ is flipped with probability q, that is $d_t=-d_{t-1}$, and each step is implemented as $W_t=W_{t-1}+d_t$. The interest is in the random variable $W_T=W_T(q)$ obtained after T steps of this random walk.

Proposition 1. The distribution of the last emission $\alpha_T$ for a Gaussian emission model for a w-qubit measurement is the Gaussian soft noise model where $f^{(\mu)}$ is the PDF of $$\mathcal{N}\left((-1)^{\beta_0} W_T(q), \sqrt{T}\,\sigma_e\right) \qquad \text{(Eq. 7)}$$

where $$q = p_e \frac{2^{w-1}}{2^w - 1}.$$

Moreover, the product of the emission errors $E=E_1 \ldots E_T$ is a uniform non-trivial error with rate $\rho_m$ equal to $$Tp_e(1 - p_e)^{T-1} + \frac{2^w - 2}{2^w - 1} \sum_{i=2}^{T} \binom{T}{i} p_e^i (1 - p_e)^{T-i}. \qquad \text{(Eq. 8)}$$

It is noted that noted that the mean $(-1)^{\mu_0} W_T(q)$ of the normal distribution is a random variable. A sample associated with $f^{(0)}$ in this model is obtained by sampling $W_T(q)$ from the correlated random walk distribution and then sampling a soft outcome from the normal distribution centered in $W_T(q)$ with standard deviation $\sqrt{T}\sigma_e$. The same procedure applies to sample from $f^{(1)}$ with a flipped starting direction $d_0=-1$.

Proof. The value of $\alpha_T$ can be written as $$a_T = \sum_{t=0}^{T-1} (-1)^{\beta_t} \tau_t + \sum_{t=0}^{T-1} v_t. \qquad \text{(Eq. 9)}$$

If the first ideal outcome is $\mu=0$, the first term $$\sum_{t=0}^{T-1} (-1)^{\beta_t}$$

is the T-th position of the correlated random walk $W_t$ (q). The random walk parameter is $$q = p_e \frac{2^{w-1}}{2^w - 1}$$

because it is the probability that an error $E_t$ induces a flip of the outcome $\tilde{\mu}_t$, that is anti-commute with the measured operator. The second term $\Sigma_t \, v_t$ is the sum of T independent random variables Tt with normal distribution $\mathcal{N}(0, \sigma_e)$. Therefore, the second term $\Sigma_t \, v_t$ is a random variable with distribution $\mathcal{N}(0, \sqrt{T\sigma_e})$. This proves Eq. 8 for $f^{(0)}$. The same argument applies in the case of a first ideal outcome $\tilde{\mu}=1$ after including a flip of the initial direction in the random walk.

The product E is non-trivial if and only if (iff) at least one of the $E_t$ is non-trivial and if the last non-trivial one is not equal to the previous product, which leads to Eq. 9. In the quantum error correction regime, the noise rate per emission $\rho_e$ is very small. Therefore, the random walk parameter q is small, and the inventors expect $W_T(q)$ to be close to T. Then, the distribution of Eq. 9 is close to $\mathcal{N}((-1)^{\mu_0}T, \sqrt{T\sigma_e})$ which can be rescaled as $$\mathcal{N}\left((-1)^{\mu_0}, \frac{\sigma_e}{\sqrt{T}}\right) \qquad \text{(Eq. 10)}$$

to match the previous Gaussian soft noise model. To obtain a circuit noise model, where measurements are represented by T-step Gaussian emissions, that is comparable to CNGSM $(\rho, \rho/2, \rho/2)$, the model CNGEM $(\rho, \rho_e, \sigma_e)$ is used with $$p_e = \frac{p}{2T} \text{ and } \sigma_e = \frac{\sigma_h(p/2)}{\sqrt{T}}$$

where $\sigma_h(\rho/2)$ is the standard deviation that corresponds to a hard flip probability of $\rho/2$, defined in Eq. 2. Based on Eq. 8, this value $\rho_e$ induces a Pauli noise rate per measurement of $\rho_m \sim \overline{T}\rho_e=\rho/2$ when p→0. The choice of $\sigma_e$ is motivated by Eq. 10. In the simulations, the circuit model with Gaussian emissions CNGEM $(\rho, \rho/200, 10\sigma_h(\rho/2))$ was used, which corresponds to $\overline{T}=100$. The constant $\overline{T}=100$ is arbitrary. It was chosen so that a 100-step Gaussian measurement has a similar noise strength as a Gaussian soft measurement in the model CNGSM $(\rho, \rho/2, \rho/2)$. The constant $\overline{T}$ can be adjusted to reflect different qubit features.

To make the simulation of Floquet code using the circuit model with Gaussian emission easier, a simplification was made which allows one to separate the sampling of the emission sequence $\alpha_1, \ldots, \alpha_T$ and the sampling of the Pauli error $E=E_1 \ldots E_T$. More precisely, the emission sequence is generated by simulating exactly the procedure described in this Section III. However, the noise affecting the quantum state is added independently at the end of the measurement with a noise rate given by Eq. 8.

C. Measurement Outcome Classifiers

Defined is an outcome classifier for a quantum measurement to be an algorithm that takes as an input an emission sequence $\alpha_0, \alpha_1, \ldots, \alpha_T$ and that returns an estimate $\hat{u} \in \{0,1\}$ of $\alpha_0$. It is assumed that the emission model parameters are known to the classifier and that the outcome $\alpha_0$ is a uniform random bit. Below, the performance of two classifiers are compared for the Gaussian emission model.

The memoryless classifier is the naive classifier that returns 0 if $\alpha_T \geq 0$ and that return 1 otherwise. This is a naive algorithm that ignores the whole sequence of data except the last point.

Figure 12:
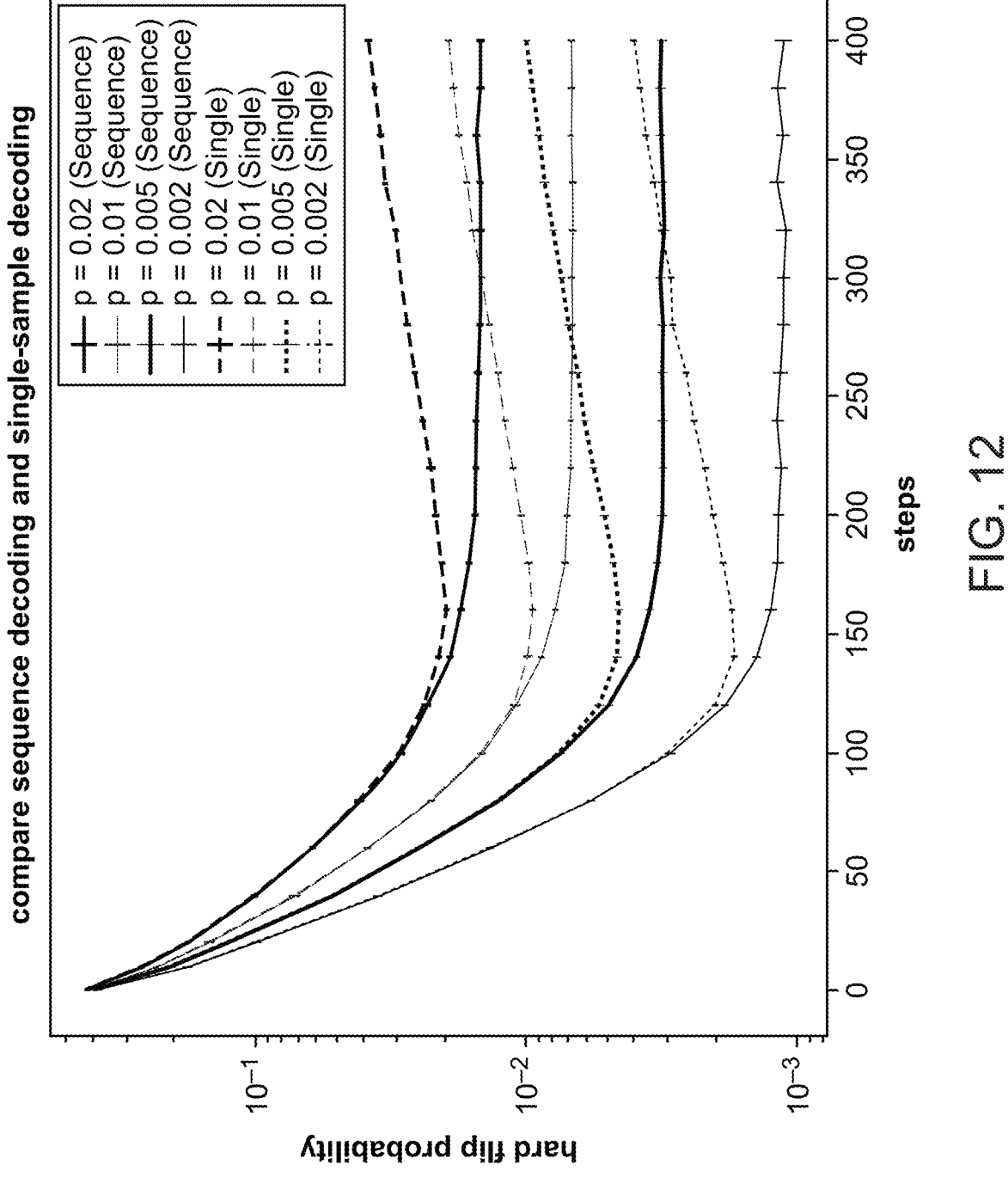
FIG. 12 depicts a graph of a comparison of the memory-less classifier that uses the last outcome of an emission sequence to estimate the ideal outcome and the backward algorithm classifier that uses the whole emission sequence to estimate the ideal outcome in accordance with one or more embodiments.

The option for this model is that one can design an optimal classifier using the standard backward algorithm (or backward-forward classifier) described by Kevin P Murphy, in *Machine learning: a probabilistic perspective*, ISBN 978-0-262-01802-9, MIT press, 2012. This standard backward algorithm is utilized to efficiently compute the probabilities of both events $\alpha_0=1$ and $\alpha_0=0$ conditioned on the observed emission sequence, allowing us to select the most likely value $\alpha_0$. This classifier is referred to as the backward algorithm classifier. FIG. 12 depicts a graph of the comparison of the memoryless classifier that uses only the last outcome to estimate the ideal outcome and the backward algorithm classifier that uses the whole emission sequence for Gaussian emission models to estimate the ideal outcome. When comparing the performance of the memoryless classifier and the backward algorithm classifier, if the measurement time is short, for example, up to 130 steps, then both classifiers seem to have a close performance. However, the situation changes when the duration of the measurement increases. When the duration of the measurement increases, the quantum state is more likely to be subjected to a Pauli error that changes the direction of the shift. As a result, the expected value of $\alpha_T$ converges to 0, degrading the performance of the naive memoryless classifier. The backward algorithm classifier, on the other hand, keeps getting (slightly) better when T (the duration of the measurement) increases because the backward algorithm classifier exploits the whole sequence. Increasing the duration of the measurement beyond 200 steps does not significantly improve the performance of the backward algorithm classifier because the latest emissions provide only little information about the first one.

D. Performance of the Floquet Codes with the Emission Model

Figure 13:
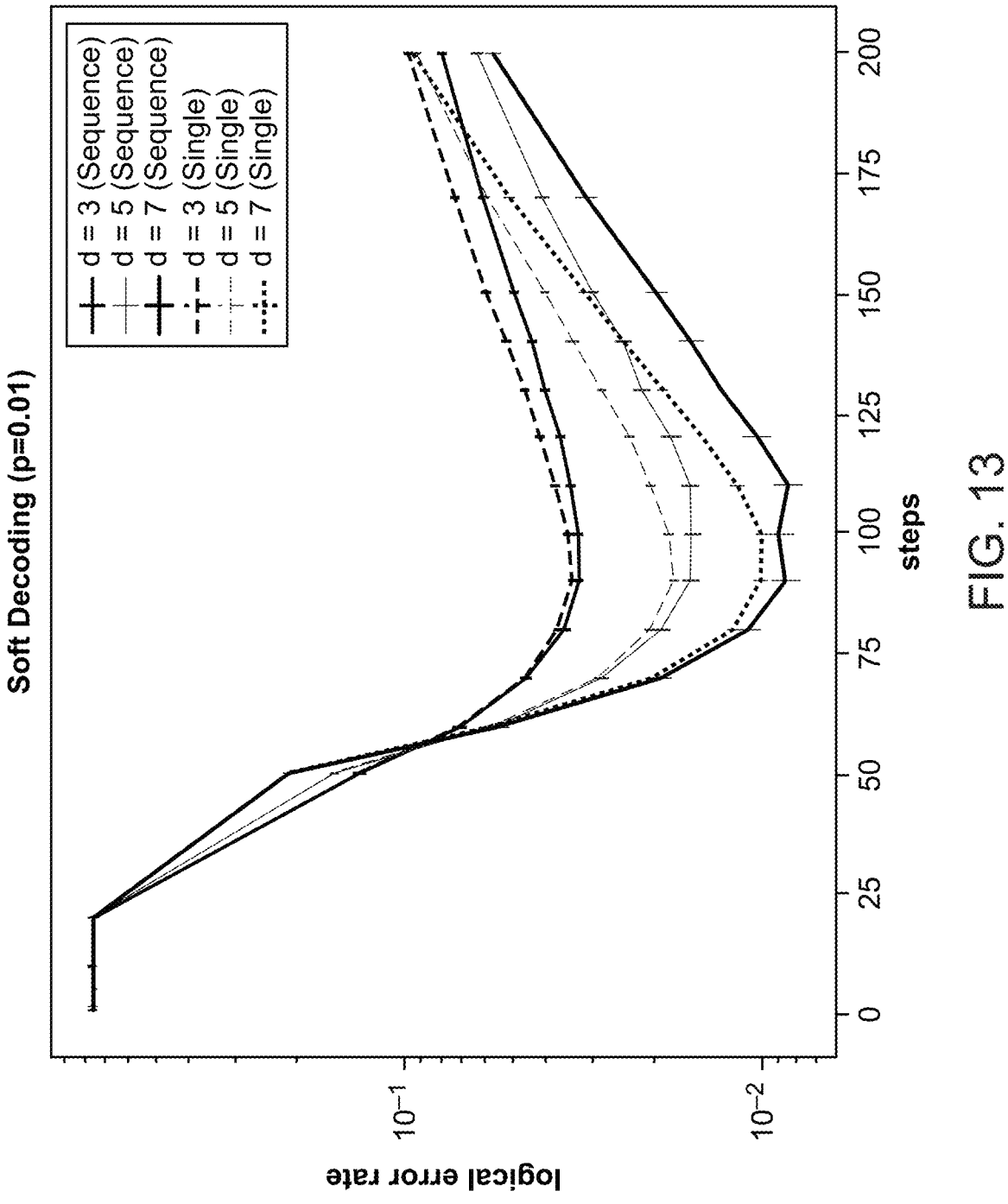
FIG. 13 depicts a graph illustrating an estimation of the logical error rate of the honeycomb code equipped with either the memoryless classifier or the backward algorithm classifier according to one or more embodiments.

The duration of the measurement is a parameter T that can be adjusted (even though T is fixed). Using faster measurements effectively reduces the qubit noise rate per measurement but a shorter emission sequence is extracted during a measurement. The optimal value of the measurement time T for a quantum error correction scheme, that is the measurement time minimizing the logical error rate of the scheme, has be studied in the case of surface codes. In FIG. 13, a graph depicts the estimation of the logical error rate of the honeycomb code equipped with either the memoryless classifier or the backward algorithm classifier. It was observed and determined that the Floquet code equipped with the memoryless classifier achieves a similar performance as the optimal classifier (e.g., backward algorithm classifier) but using only a single emission from the sequence. Moreover, the optimal measurement duration for this quantum error correction scheme is close to T=100 steps. In this regime, the gap in logical error rate induced by the choice of the classifier is minor (less than 2 times). This makes the memoryless classifier relevant to reduce the bandwidth by using only the last emission at the price of less of a negligible increase in logical error rate. Moreover, based on Section IIB, it is enough to store this last emission with only six (6) bits of precision. Using Eq. 4, the experimenters estimated that if a sequence of ten 16-bit data points per measurement were used, the Floquet codes may require a bandwidth of 3.5 Pbit/s to run Shor's algorithm for the factorization of a 2,048-bit integer. This number drops by 27 times using the memoryless classifier with 6-bit precision.

E. Optimal Measurement Time

The optimal measurement time depends on various factors including the relative strength of the Pauli errors $\rho_e$ and the emission noises $\sigma e$. The inventors define the noise ratio $R=\rho_e/\rho_h(\sigma_e)$. Assuming that the total error rate is $p=\rho_e+\rho_h(\sigma_e)$, assigned are the parameters of CNGEM $(\rho_u, \rho_e, \sigma_e)$ by $$p_u = p, \quad p_e = \frac{Rp}{(1+R)\overline{T}} \quad \text{and} \quad \sigma_e = \sigma_h\left(\frac{p}{1+R}\right)\frac{1}{\sqrt{\overline{T}}}.$$

In this Section III E, the duration of the measurement is set $\overline{T}=10$, and the measurement duration T is varied to explore the performance of the classifiers and the soft decoder for different noise ratios R.

By simulating the performance of the Floquet codes with a different noise ratio R, it is seen and determined that the optimal measurement duration, that is the value T achieving the smallest logical error rate, is reached when $T\rho_e=\rho_h(\sqrt{T}\sigma_e)$. Based on Proposition 1, this corresponds to the regime when the qubit noise and the hard flip probability on the last emission match. Injecting the value of $\rho_e$ and $\sigma_e$ as a function of R, in this equation, the experimenters can predict that the optimal measurement duration is the value T such that $$\sigma_h\left(\frac{R}{(1+R)}\frac{T}{\overline{T}}\right) = \sigma_h\left(\frac{p}{1+R}\right)\sqrt{\frac{T}{\overline{T}}}. \qquad \text{(Eq. 11)}$$

Figure 14:
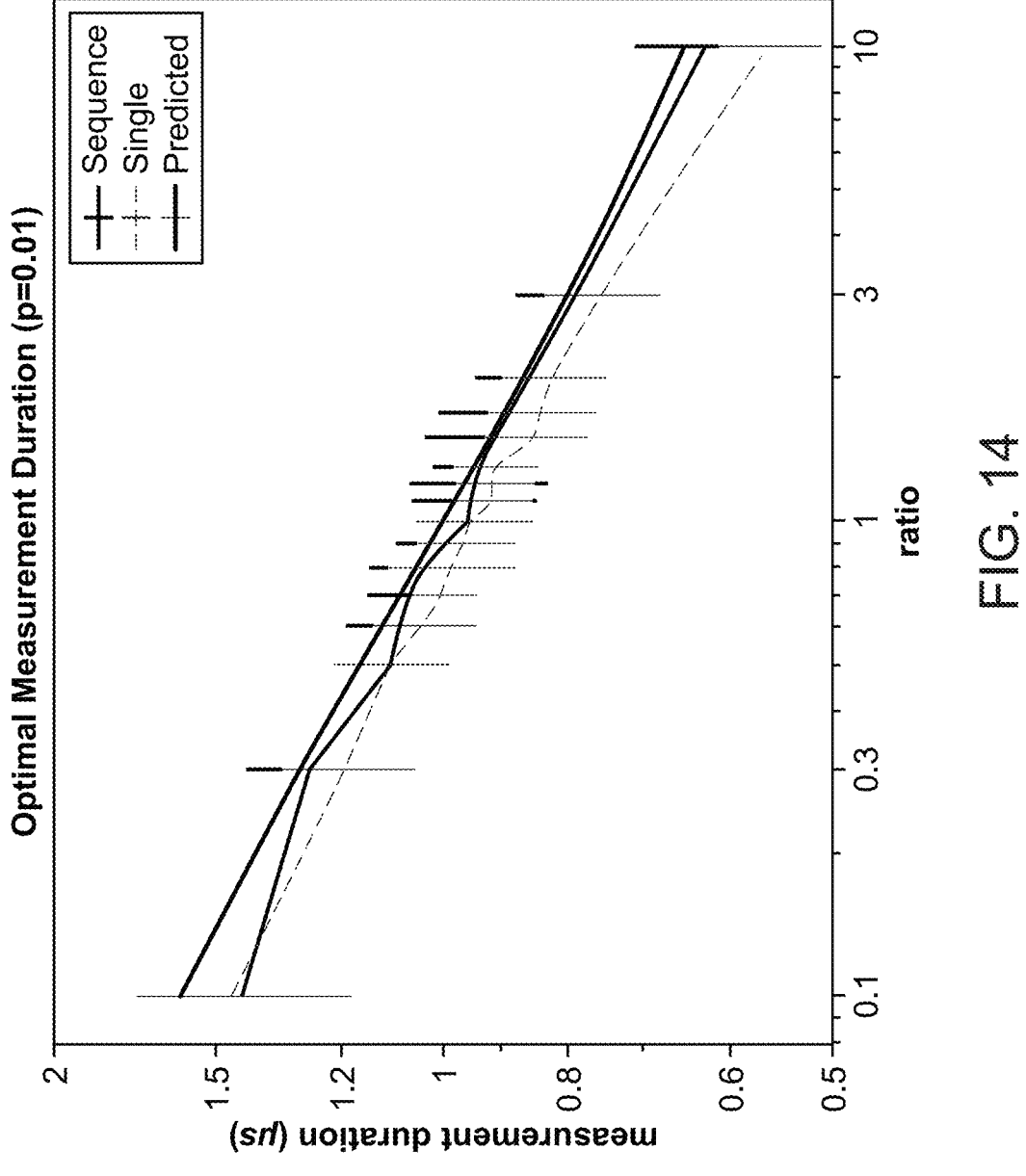
FIG. 14 depicts a graph illustrating that the prediction matches the optimal duration obtained by a full numerical simulation of the Floquet codes according to one or more embodiments.

FIG. 14 is a graph depicting that the prediction matches the optimal duration obtained by a full numerical simulation of the Floquet codes. Moreover, in the regime of the optimal measurement time, the inventors observed and determined that the two classifiers perform similarly. For the circuit, it is determined that the optimal measurement time is independent of $\rho_u$ because the circuit does not include any unitary gates.

Further, FIG. 14 depicts a graph illustrating the optimal measurement duration T for the Gaussian emission model that can be predicted by Eq. 11 as a function of the noise rate $\rho$, the noise ratio R, and the parameter $\overline{T}$. In this plot, it is considered that a duration $T=\overline{T}$ corresponds to 1 µs and the measurement time in us is given by $T/\overline{T}$. The experimenters compare the predicted optimal duration with the optimal measurement time obtained with a soft decoder and with the two different classifiers using a single outcome (memoryless classifier) and using the whole emission sequence (backward-algorithm).

FIG. 15 is a flowchart of a computer-implemented method 1500 for soft decoding of Floquet codes in order to obtain additional and/or improved quantum measurements from a quantum circuit and to provide error correction for qubits 14 in the quantum circuit 12, logical qubits, and/or software in accordance with one or more embodiments. Reference can be made to any of the figures.

At block 1502, the software 111 is configured to send inputs 28 according to the Floquet codes to be processed by the quantum circuit 12. At block 1504, the software 111 is configured to receive data streams from the quantum circuit 12, in response to the inputs 28. At block 1506, the software 111 is configured to encode the data streams into a predetermined number of bits according to a probability density function (e.g., such as the probability density function 1002 depicted in FIG. 10B) for noise. At block 1508, the software 111 is configured to classify the data streams into hard outcomes having likelihoods of correctness (e.g., confidences), the hard outcomes representing output of the quantum circuit 12.

Encoding the data streams into the predetermined number of the bits according to the probability density function for noise comprises dividing the probability density function into unequal intervals, the unequal intervals having an equal probability of occurring in the probability density function, as depicted in FIG. 10B. Encoding the data streams into the predetermined number of the bits according to the probability density function comprises assigning data values to unequal intervals of the probability density function, and the bits are configured to correspond to one of the data values for the unequal intervals, as depicted in FIG. 10B.

A memoryless classifier is utilized to classify the data streams into the hard outcomes having the likelihoods of correctness (e.g., confidences). A backward-forward classifier is utilized to classify the data streams into the hard outcomes having the likelihoods of correctness (e.g., confidences). The data streams comprise a sequence of values, and the encoding the data streams into the predetermined number of bits according to a probability density function comprises compressing at least a portion of the sequence of values into the predetermined number of the bits. The software 111 uses a soft decoder 150 to provide error correction that identifies a fault location associated with the quantum circuit 12 based on the hard outcomes and the likelihoods of correctness (e.g., confidences).

Figure 16:
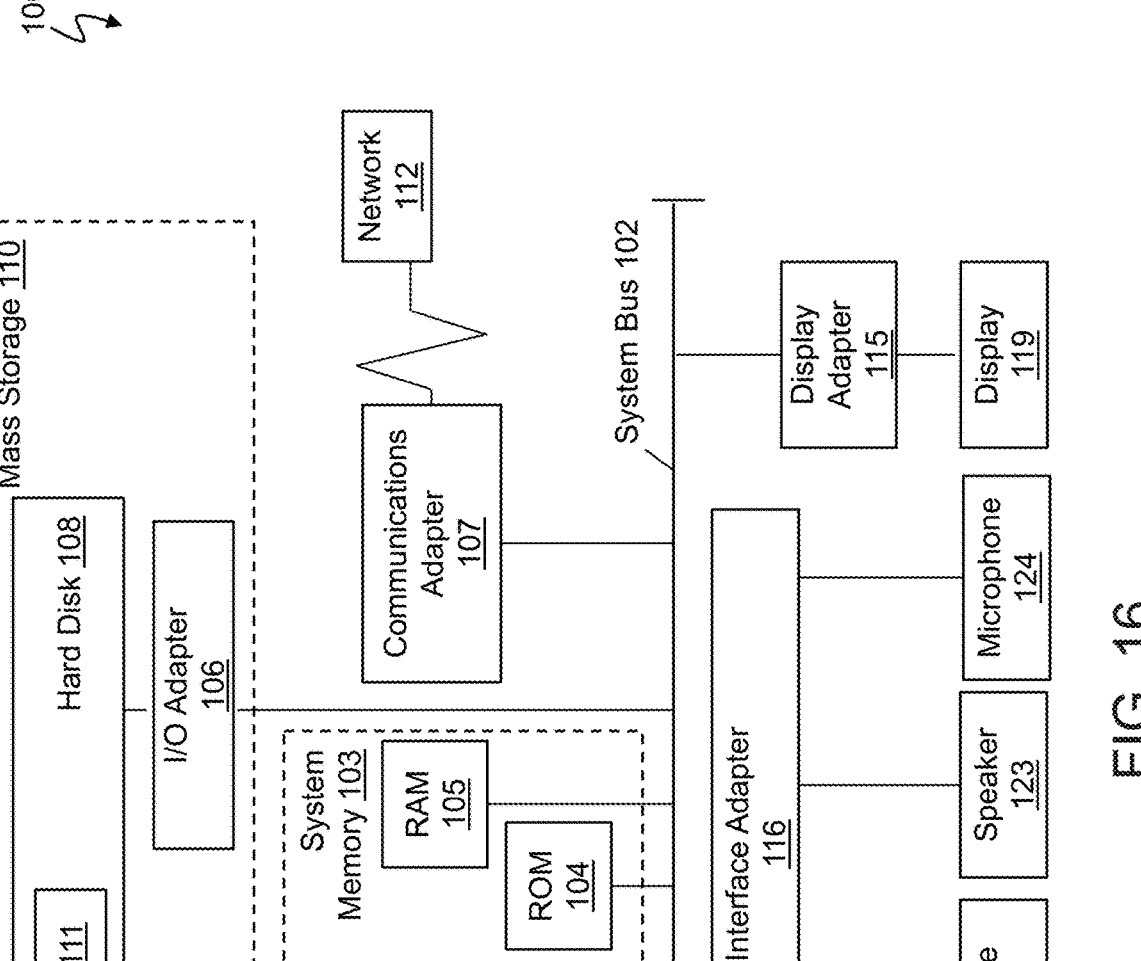
FIG. 16 depicts a block diagram of a classical computer system according to one or more embodiments.

Turning now to FIG. 16, a computer system 100 is generally shown in accordance with one or more embodiments of the invention. The computer system 100 can be an electronic, computer framework comprising and/or employing any number and combination of computing devices and networks utilizing various communication technologies, as described herein. The computer system 100 can be easily scalable, extensible, and modular, with the ability to change to different services or reconfigure some features independently of others. The computer system 100 may be, for example, a server, desktop computer, laptop computer, tablet computer, or smartphone. In some examples, computer system 100 may be a cloud computing node. Computer system 100 may be described in the general context of computer system executable instructions, such as program modules, being executed by a computer system. Generally, program modules may include routines, programs, objects, components, logic, data structures, and so on that perform particular tasks or implement particular abstract data types. Computer system 100 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 16 the computer system 100 has one or more central processing units (CPU(s)) 101a, 101b, 101c, etc., (collectively or generically referred to as processor(s) 101). The processors 101 can be a single-core processor, multi-core processor, computing cluster, or any number of other configurations. The processors 101, also referred to as processing circuits, are coupled via a system bus 102 to a system memory 103 and various other components. The system memory 103 can include a read only memory (ROM) 104 and a random access memory (RAM) 105. The ROM 104 is coupled to the system bus 102 and may include a basic input/output system (BIOS) or its successors like Unified Extensible Firmware Interface (UEFI), which controls certain basic functions of the computer system 100. The RAM is read-write memory coupled to the system bus 102 for use by the processors 101. The system memory 103 provides temporary memory space for operations of said instructions during operation. The system memory 103 can include random access memory (RAM), read only memory, flash memory, or any other suitable memory systems.

The computer system 100 comprises an input/output (I/O) adapter 106 and a communications adapter 107 coupled to the system bus 102. The I/O adapter 106 may be a small computer system interface (SCSI) adapter that communicates with a hard disk 108 and/or any other similar component. The I/O adapter 106 and the hard disk 108 are collectively referred to herein as a mass storage 110.

Software 111 for execution on the computer system 100 may be stored in the mass storage 110. The mass storage 110 is an example of a tangible storage medium readable by the processors 101, where the software 111 is stored as instructions for execution by the processors 101 to cause the computer system 100 to operate, such as is described herein below with respect to the various Figures. Examples of computer program product and the execution of such instruction is discussed herein in more detail. The communications adapter 107 interconnects the system bus 102 with a network 112, which may be an outside network, enabling the computer system 100 to communicate with other such systems. In one embodiment, a portion of the system memory 103 and the mass storage 110 collectively store an operating system, which may be any appropriate operating system to coordinate the functions of the various components shown in FIG. 16.

Additional input/output devices are shown as connected to the system bus 102 via a display adapter 115 and an interface adapter 116. In one embodiment, the adapters 106, 107, 115, and 116 may be connected to one or more I/O buses that are connected to the system bus 102 via an intermediate bus bridge (not shown). A display 119 (e.g., a screen or a display monitor) is connected to the system bus 102 by the display adapter 115, which may include a graphics controller to improve the performance of graphics intensive applications and a video controller. A keyboard 121, a mouse 122, a speaker 123, a microphone 124, etc., can be interconnected to the system bus 102 via the interface adapter 116, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI) and the Peripheral Component Interconnect Express (PCIe). Thus, as configured in FIG. 16, the computer system 100 includes processing capability in the form of the processors 101, storage capability including the system memory 103 and the mass storage 110, input means such as the keyboard 121, the mouse 122, and the microphone 124, and output capability including the speaker 123 and the display 119.

In some embodiments, the communications adapter 107 can transmit data using any suitable interface or protocol, such as the internet small computer system interface, among others. The network 112 may be a cellular network, a radio network, a wide area network (WAN), a local area network (LAN), or the Internet, among others. An external computing device may connect to the computer system 100 through the network 112. In some examples, an external computing device may be an external webserver or a cloud computing node.

It is to be understood that the block diagram of FIG. 16 is not intended to indicate that the computer system 100 is to include all of the components shown in FIG. 16. Rather, the computer system 100 can include any appropriate fewer or additional components not illustrated in FIG. 16 (e.g., additional memory components, embedded controllers, modules, additional network interfaces, etc.). Further, the embodiments described herein with respect to computer system 100 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

While the disclosure has been described with reference to various embodiments, it will be understood by those skilled in the art that changes may be made and equivalents may be substituted for elements thereof without departing from its scope. The various tasks and process steps described herein can be incorporated into a more comprehensive procedure or process having additional steps or functionality not described in detail herein. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

Unless defined otherwise, technical and scientific terms used herein have the same meaning as is commonly understood by one of skill in the art to which this disclosure belongs.

Various embodiments of the invention are described herein with reference to the related drawings. The drawings depicted herein are illustrative. There can be many variations to the diagrams and/or the steps (or operations) described therein without departing from the spirit of the disclosure. For instance, the actions can be performed in a differing order or actions can be added, deleted or modified. All of these variations are considered a part of the present disclosure.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof. The term "or" means "and/or" unless clearly indicated otherwise by context.

The terms "received from", "receiving from", "passed to", "passing to", etc. describe a communication path between two elements and does not imply a direct connection between the elements with no intervening elements/connections therebetween unless specified. A respective communication path can be a direct or indirect communication path.

The corresponding structures, materials, acts, and equivalents of all means or step plus function elements in the claims below are intended to include any structure, material, or act for performing the function in combination with other claimed elements as specifically claimed.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

The present invention may be a system, a method, and/or a computer program product at any possible technical detail level of integration. The computer program product may include a computer readable storage medium (or media) having computer readable program instructions thereon for causing a processor to carry out aspects of the present invention.

Various embodiments are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments described herein have been presented for purposes of illustration, but are not intended to be exhaustive or limited to the form(s) disclosed. The embodiments were chosen and described in order to best explain the principles of the disclosure. Many modifications and variations will be apparent to those of ordinary skill in the art without departing from the scope and spirit of the described embodiments. The terminology used herein was chosen to best explain the principles of the various embodiments, the practical application or technical improvement over technologies found in the marketplace, or to enable others of ordinary skill in the art to understand the embodiments described herein.

What is claimed is:

1. A method for decoding Floquet codes, the method comprising:
    sending inputs according to the Floquet codes to be processed by a quantum circuit;
    receiving data streams from the quantum circuit, in response to the inputs;
    encoding the data streams into a predetermined number of bits according to a probability density function for noise; and
    classifying the data streams into hard outcomes, the hard outcomes representing output of the quantum circuit.

2. The method of claim 1, wherein encoding the data streams into the predetermined number of the bits according to the probability density function for noise comprises dividing the probability density function into unequal intervals, the unequal intervals having an equal probability of occurring in the probability density function.

3. The method of claim 1, wherein:
    encoding the data streams into the predetermined number of the bits according to the probability density function comprises assigning data values to unequal intervals of the probability density function; and
    the bits are configured to correspond to one of the data values for the unequal intervals.

4. The method of claim 1, wherein a memoryless classifier is utilized to classify the data streams into the hard outcomes having the likelihoods of correctness.

5. The method of claim 1, wherein a backward-forward classifier is utilized to classify the data streams into the hard outcomes having the likelihoods of correctness.

6. The method of claim 1, wherein:
    the data streams comprise a sequence of values; and
    the encoding the data streams into the predetermined number of bits according to a probability density func-
    tion comprises compressing at least a portion of the sequence of values into the predetermined number of the bits.

7. The method of claim 1, further comprising using a soft decoder to provide error correction that identifies a fault location associated with the quantum circuit based on the hard outcomes and the likelihoods of correctness.

8. A system having a memory, computer readable instructions, and a processor for executing the computer readable instructions, the computer readable instructions controlling the processor to perform operations comprising:
    sending inputs according to Floquet codes to be processed by a quantum circuit;
    receiving data streams from the quantum circuit, in response to the inputs;
    encoding the data streams into a predetermined number of bits according to a probability density function for noise; and
    classifying the data streams into hard outcomes, the hard outcomes representing output of the quantum circuit.

9. The system of claim 8, wherein encoding the data streams into the predetermined number of the bits according to the probability density function for noise comprises dividing the probability density function into unequal intervals, the unequal intervals having an equal probability of occurring in the probability density function.

10. The system of claim 8, wherein:
    encoding the data streams into the predetermined number of the bits according to the probability density function comprises assigning data values to unequal intervals of the probability density function; and
    the bits are configured to correspond to one of the data values for the unequal intervals.

11. The system of claim 8, wherein a memoryless classifier is utilized to classify the data streams into the hard outcomes having the likelihoods of correctness.

12. The system of claim 8, wherein a backward-forward classifier is utilized to classify the data streams into the hard outcomes having the likelihoods of correctness.

13. The system of claim 8, wherein:
    the data streams comprise a sequence of values; and
    the encoding the data streams into the predetermined number of bits according to a probability density function comprises compressing at least a portion of the sequence of values into the predetermined number of the bits.

14. The system of claim 8, wherein the processor is controlled to perform the operations further comprising using a soft decoder to provide error correction that identifies a fault location associated with the quantum circuit based on the hard outcomes and the likelihoods of correctness.

15. A system comprising:
    a quantum circuit;
    a computer coupled to the quantum circuit and comprising a processor controlled to perform operations comprising:
    sending inputs according to Floquet codes to be processed by the quantum circuit;
    receiving data streams from the quantum circuit, in response to the inputs;
    encoding the data streams into a predetermined number of bits according to a probability density function for noise; and
    classifying the data streams into hard outcomes, the hard outcomes representing output of the quantum circuit.

16. The system of claim 15, wherein encoding the data streams into the predetermined number of the bits according to the probability density function for noise comprises dividing the probability density function into unequal intervals, the unequal intervals having an equal probability of occurring in the probability density function.

17. The system of claim 15, wherein:

encoding the data streams into the predetermined number of the bits according to the probability density function comprises assigning data values to unequal intervals of the probability density function; and the bits are configured to correspond to one of the data values for the unequal intervals.

18. The system of claim 15, wherein a memoryless classifier is utilized to classify the data streams into the hard outcomes having the likelihoods of correctness.

19. The system of claim 15, wherein a backward-forward classifier is utilized to classify the data streams into the hard outcomes having the likelihoods of correctness.

20. The system of claim 15, wherein:

the data streams comprise a sequence of values; and the encoding the data streams into the predetermined number of bits according to a probability density function comprises compressing at least a portion of the sequence of values into the predetermined number of the bits.

\* \* \* \* \*